(12) United States Patent
Chew

(10) Patent No.: US 11,543,439 B1
(45) Date of Patent: Jan. 3, 2023

(54) POWER SUPPLY CURRENT DETECTION CIRCUIT AND ITS CONTROL METHOD, DEVICE, AMPLIFIER AND STORAGE MEDIUM

(71) Applicant: Halo Microelectronics Co., Ltd., Foshan (CN)

(72) Inventor: Kinwai Chew, Singapore (SG)

(73) Assignee: Halo Microelectronics Co., Ltd., Foshan (CN)

( * ) Notice: Subject to any disclaimer, the term of this patent is extended or adjusted under 35 U.S.C. 154(b) by 0 days.

(21) Appl. No.: 17/824,163

(22) Filed: May 25, 2022

(30) Foreign Application Priority Data

Mar. 17, 2022 (CN) .......................... 202210264122.6

(51) Int. Cl.
*G01R 19/00* (2006.01)
*G01R 19/165* (2006.01)
*G01R 19/10* (2006.01)

(52) U.S. Cl.
CPC ....... *G01R 19/16576* (2013.01); *G01R 19/10* (2013.01)

(58) Field of Classification Search
CPC .. H02M 3/156; H02M 1/0009; H02M 1/0032; H02M 3/145; H02M 1/0003; H02M 3/1566; H02M 1/0054; H02M 1/4208; H02M 3/33507; H02M 7/53862; H02M 1/00; H02M 1/0043; H02M 3/137; H02M 3/3376; H03F 3/217; H03F 2203/45288; H03F 2203/45528; H03F 3/347; H03F 1/34; H03F 3/2171; H03F 2200/261; H03F 3/087; H03F 3/45; H03F 2200/129; H03F 1/3211; H03F 3/45273; H03F 3/393; H03F 3/45179; H03F 2203/45614; H03F 2200/453; H03F 2200/462; H03F 3/26;

(Continued)

(56) References Cited

U.S. PATENT DOCUMENTS 3,599,101 A 8/1971 Merrill
3,603,846 A 9/1971 Toth (Continued)

FOREIGN PATENT DOCUMENTS

CN 103197122 A 7/2013
CN 103592498 A 2/2014

(Continued)

*Primary Examiner* — Vinh P Nguyen
(74) *Attorney, Agent, or Firm* — Slater Matsil, LLP

(57) ABSTRACT

The current detection circuit includes a signal amplification branch, a first voltage branch, a second voltage branch and a first feedback circuit branch. The first feedback branch generates a feedback signal according to the first voltage generated by the first voltage branch, the second voltage and the first reference voltage generated by the second voltage branch. The signal amplification branch generates a first amplified voltage according to the first voltage and the feedback signal, and generates a second amplified voltage according to the second voltage and the feedback signal. The first voltage branch generates a first voltage and a first output voltage according to the first input voltage and the first (Continued)

amplified voltage. The second voltage branch generates a second voltage and a second output voltage according to the second input voltage and the second amplified voltage.

18 Claims, 14 Drawing Sheets

(58) Field of Classification Search
CPC .... H03F 3/3083; H03F 1/083; H03F 3/45744; H03F 1/342; H03F 1/303; H03F 2200/471; H03F 2200/481; H03F 2203/45212; H03F 2200/435; H03F 2200/372; H03F 3/45968; H03F 3/45977; H03F 1/0205; H03F 1/30; H03F 1/26; H03F 1/301; H03F 1/3229; H03F 2200/144; H03F 2203/45074; H03F 2203/45061; H03F 2203/30031; H03F 2200/78; H03F 2200/498; H03F 2200/411; H03F 2200/408; H03F 3/265; H03F 3/3001; H03F 3/3023; H03F 3/3069; H03F 3/45569; H03F 3/45542; H03F 3/45506; H03F 3/45237; H03F 3/45632; H03F 3/4595; H03F 3/45991; H03F 3/505; H03G 7/004; H03G 3/20; G01R 35/007; G01R 1/203; G01R 19/0023; G01R 19/0092; G01R 19/165; G01R 35/005; G01R 31/2884; G01R 21/00; G01R 33/0041; G01R 35/00; G01R 19/0084; G01R 19/10; G01R 19/16547

See application file for complete search history.

(56) References Cited

U.S. PATENT DOCUMENTS

| | | | | |
|---|---|---|---|---|
| 7,535,305 | B1* | 5/2009 | Li | H03F 3/45192 |
| | | | | 330/267 |
| 7,710,094 | B1* | 5/2010 | Wong | H02M 3/156 |
| | | | | 323/284 |
| 9,678,521 | B2* | 6/2017 | Liu | H02M 3/156 |
| 9,806,617 | B1* | 10/2017 | Ozawa | H02M 3/1588 |
| 10,416,695 | B1* | 9/2019 | Bohannon | H03F 3/45192 |
| 10,469,073 | B1* | 11/2019 | Ozalevli | H02M 3/156 |
| 10,491,167 | B1* | 11/2019 | Far | H03F 3/04 |
| 10,928,425 | B2* | 2/2021 | Lo Muzzo | H03F 1/523 |
| 11,018,640 | B2* | 5/2021 | Grasso | H03F 3/45659 |

FOREIGN PATENT DOCUMENTS

| | | |
|---|---|---|
| CN | 108918958 A | 11/2018 |
| CN | 109061272 A | 12/2018 |
| CN | 208188196 U | 12/2018 |
| CN | 112448704 A | 3/2021 |
| CN | 112730957 A | 4/2021 |
| CN | 113259828 A | 8/2021 |
| CN | 114006547 A | 2/2022 |
| DE | 2022054 A1 | 12/1970 |
| EP | 2128633 A1 | 12/2009 |
| GB | 2192994 A | 1/1988 |

* cited by examiner

POWER SUPPLY CURRENT DETECTION CIRCUIT AND ITS CONTROL METHOD, DEVICE, AMPLIFIER AND STORAGE MEDIUM

PRIORITY CLAIM

This application claims the benefit of and priority to Chinese patent Application No. 2022102641226, filed on Mar. 17, 2022, which is hereby incorporated by reference in its entirety.

TECHNICAL FIELD

The present application relates to the field of detection technology, and in particular, to a current detection circuit and its control method, device, amplifier and storage medium.

BACKGROUND

A current detection circuit can be used for power supply charge monitoring and overcurrent protection. At present, the commonly used current detection scheme is to first add a small detection resistor to the current path, then a small voltage drop will be formed across the detection resistor, and then the voltage drop across the detection resistor will be amplified by an amplifier to output a voltage signal proportional to the current measured. The output voltage is measured to eventually realize current detection.

However, the voltage range that the existing current detection scheme can support is very limited, and it is not suitable for detecting input current of USB-PD interfaces that supports a wide voltage range (e.g., 5V-20V).

SUMMARY

The present application aims to provide a current detection circuit and its control method, device, amplifier and storage medium, which can improve the voltage range supported by the current detection scheme.

In order to achieve the above purpose, in a first aspect, the present application provides a current detection circuit, comprising a signal amplification branch, a first voltage branch, a second voltage branch and a first feedback branch.

The first terminal of the signal amplification branch is connected to the first terminal of the first voltage branch and the first terminal of the first feedback branch, and the second terminal of the signal amplification branch is connected to the first terminal of the first feedback branch. The third terminal of the signal amplification branch is connected to the first terminal of the second voltage branch and the second terminal of the first feedback branch. A fourth terminal of the signal amplification branch is connected to the second terminal of the second voltage branch. The fifth terminal of the signal amplification branch is connected to the third terminal of the first feedback branch. The third terminal of the first voltage branch is connected to the first input voltage. The third terminal of the second voltage branch is connected to the second input voltage. The fourth terminal of the first feedback branch is used to receive the first reference voltage.

The first feedback branch is configured to generate a feedback signal according to a first voltage generated by the first voltage branch, a second voltage generated by the second voltage branch, and the first reference voltage.

The signal amplification branch is used for generating a first amplified voltage according to the first voltage and the feedback signal, and generating a second amplified voltage according to the second voltage and the feedback signal.

The first voltage branch is used for generating the first voltage and a first output voltage according to the first input voltage and the first amplified voltage.

The second voltage branch is used for generating the second voltage and a second output voltage according to the second input voltage and the second amplified voltage.

The first output voltage is output from the fourth terminal of the first voltage branch. The second output voltage is output from the fourth terminal of the second voltage branch. The first output voltage and the second output voltage are used to determine the difference between the first input voltage and the second input voltage, which further determines the current between the third terminal of the first voltage branch and the third terminals of the second voltage branch.

Optionally, the current detection circuit further includes a second feedback branch and a first resistor.

The second feedback branch is used for providing a first feedback current to generate a voltage drop across the first resistor, and the first reference voltage is determined according to the voltage drop and the second input voltage.

Optionally, the signal amplification branch includes an amplifier. The amplifier includes a first transistor and a second transistor. The first terminal of the first transistor is the first terminal of the signal amplification branch terminal. The first terminal of the second transistor is the third terminal of the signal amplification branch.

The second feedback branch includes a first transconductance amplifier or a second transconductance amplifier. When the second feedback branch includes the first transconductance amplifier, the second feedback branch further includes a second resistor and a third resistor. The second terminal of the first transconductance amplifier is connected to the first terminal of the second resistor and the first terminal of the third resistor. The third terminal of the first transconductance amplifier is used for receiving a second reference voltage. The first terminal of the first transconductance amplifier is connected to the first terminal of the first resistor and the fourth terminal of the first feedback branch. The second terminal of the second resistor is the input of a first detection voltage representing the voltage difference between the second terminal and the third terminal of the first transistor. The second terminal of the third resistor is an input of a second detection voltage representing the voltage difference between the second terminal and the third terminal of the second transistor. When the second feedback branch includes the second transconductance amplifier, the second terminal of the second transconductance amplifier is used to receive a first voltage signal representing the second input voltage. The third terminal of the second transconductance amplifier is used to receive a second voltage signal representing the supply voltage of the signal amplification branch. The first terminal of the second transconductance amplifier is connected to the first terminal of the first resistor and the fourth terminal of the first feedback branch.

Optionally, the second feedback branch further includes a fourth current source, and the positive terminal of the fourth current source is grounded.

The negative terminal of the fourth current source is connected to the first terminal of the first transconductance amplifier, or the negative terminal of the fourth current source is connected to the first terminal of the second transconductance amplifier.

Optionally, the first voltage signal is a difference between 1/n of the second input voltage and a first preset bias voltage, n≥1.

The second voltage signal is 1/n of the supply voltage.

Optionally, the gain of the second transconductance amplifier is n/r1, where r1 is the resistance value of the first resistor.

Optionally, the amplifier in the signal amplification branch further includes a third transistor, a fourth transistor, a fifth transistor, a sixth transistor, a first current source, a second current source and a third current source.

The first terminal of the third transistor is connected to the first terminal of the fourth transistor and the third terminal of the first feedback branch. The second terminal of the third transistor and the second terminal of the fourth transistor are both connected to the supply voltage. The third terminal of the third transistor is connected to the second terminal of the fifth transistor and the third terminal of the first transistor. The second terminal of the first transistor is connected to the second terminal of the second transistor and the negative terminal of the second current source. The first terminal of the fifth transistor and the first terminal of the sixth transistor are both used for receiving a third voltage. The third terminal of the fifth transistor is connected to the second terminal of the first voltage branch and the negative terminal of the first current source. The third terminal of the fourth transistor is connected to the second terminal of the sixth transistor and the third terminal of the second transistor. The third terminal of the sixth transistor is connected to the second terminal of the second voltage branch and the negative terminal of the third current source. The positive terminal of the first current source, the positive terminal of the second current source, and the positive terminal of the third current source are all grounded.

Optionally, the first voltage branch includes a fourth resistor, a seventh transistor, and a fifth resistor.

The first terminal of the fourth resistor is connected to the first input voltage. The second terminal of the fourth resistor is connected to the second terminal of the seventh transistor and the first terminal of the signal amplification branch. The first terminal of the seventh transistor is connected to the second terminal of the signal amplification branch. The third terminal of the seventh transistor is connected to the first terminal of the fifth resistor. The second terminal of the fifth resistor is grounded. The third terminal of the seventh transistor is the fourth terminal of the first voltage branch.

Optionally, the second voltage branch includes a sixth resistor, an eighth transistor and a seventh resistor.

The first terminal of the sixth resistor is connected to the second input voltage. The second terminal of the sixth resistor is connected to the second terminal of the eighth transistor and the third terminal of the signal amplification branch. The first terminal of the eighth transistor is connected to the fourth terminal of the signal amplification branch. The third terminal of the eighth transistor is connected to the first terminal of the seventh resistor. The second terminal of the seventh resistor is grounded. The third terminal of the eighth transistor is the fourth terminal of the second voltage branch.

Optionally, the first feedback branch includes an eighth resistor, a ninth resistor and a comparator.

The first terminal of the eighth resistor is connected to the first terminal of the signal amplification branch. The second terminal of the eighth resistor is connected to the first terminal of the ninth resistor and the first input terminal of the comparator. The second terminal of the ninth resistor is connected to the third terminal of the signal amplification branch. The second input terminal of the comparator is used to receive the first reference voltage. The output terminal of the comparator is connected to the fifth terminal of the signal amplification branch.

In a second aspect, the present application provides a method for controlling a current detection circuit. A first terminal of the current detection circuit is connected to a first input voltage. A second terminal of the current detection circuit is connected to a second input voltage. The current detection circuit is used for outputting a first output voltage and a second output voltage according to the first input voltage and the second input voltage, and determines the current between the first terminal and the second terminal of the circuit according to the first output voltage and the second output voltage.

The method includes determining a first voltage and a second voltage input to the amplifier in the current detection circuit, and determining an adjustable first reference voltage, generating a feedback signal according to the first voltage, the second voltage and the first reference voltage.

The common mode value of the first voltage and the second voltage is adjusted according to the feedback signal, so that the current detection circuit outputs the first output voltage and the second output voltage.

Optionally, the step of determining the adjustable first reference voltage includes obtaining a first voltage signal representing the second input voltage, and a second voltage signal representing a supply voltage of the amplifier.

The first reference voltage is determined according to a first difference between the first voltage signal and the second voltage signal.

Optionally, the method further includes: if the first difference is not greater than the first preset difference, the voltage difference between the second input voltage and the first reference voltage is kept constant.

Optionally, the method further includes: if the first difference is greater than the first preset difference, the first reference voltage is kept constant.

Optionally, the method further includes: if the second input voltage is less than the supply voltage, the voltage difference between the first reference voltage and the second input voltage is kept constant. If the second input voltage is greater than the supply voltage, the voltage difference between the first reference voltage and the supply voltage is kept constant. The voltage difference between the first reference voltage and the second input voltage is equal to the voltage difference between the first reference voltage and the supply voltage.

Optionally, the amplifier includes a first transistor and a second transistor. A first terminal of the first transistor is connected to the first input voltage. A first terminal of the second transistor is connected to the second input voltage.

The steps for determining of the adjustable first reference voltage includes obtaining a first detection voltage representing the voltage difference between the second terminal and the third terminal of the first transistor and a second detection voltage representing the voltage difference between the second terminal and the third terminal of the second transistor. The first reference voltage is determined according to the first detection voltage, and/or the second detection voltage.

Optionally, the method further includes: if the first detection voltage is not greater than the first voltage threshold, and/or the second detection voltage is not greater than the first voltage threshold, the first reference voltage is lowered.

Optionally, the method further includes: if the first detection voltage is greater than the first voltage threshold and the second detection voltage is greater than the first voltage threshold, the voltage difference between the first reference voltage and the second input voltage is maintained constant.

In a third aspect, the present application provides a control device for a current detection circuit, comprising at least one processor and a memory communicatively coupled to the at least one processor. The memory stores instructions executable by the at least one processor. The instructions being executed by the at least one processor, and at least one processor is capable of executing the method as described above.

In a fourth aspect, the present application provides a current detection amplifier, comprising: the above-mentioned current detection circuit, and/or the above-mentioned control device of the current detection circuit.

In a fifth aspect, the present application provides a non-volatile computer-readable storage medium, the computer-readable storage medium stores computer-executable. When the computer-executable instructions are executed by a processor, the processor implements the method described above.

The beneficial effect of the present application is that the current detection circuit provided by the present application includes a signal amplification branch, a first voltage branch, a second voltage branch and a first feedback branch. The first feedback branch is used for generating a feedback signal according to the first voltage generated by the first voltage branch, the second voltage generated by the second voltage branch and the first reference voltage. The signal amplification branch is used for generating a first amplified voltage according to the first voltage and the feedback signal and generating a second amplified voltage according to the second voltage and the feedback signal. The first voltage branch is used for generating the first voltage and the first output voltage according to the first input voltage and the first amplified voltage. The second voltage branch is used for generating the second voltage and the second output voltage according to the second input voltage and the second amplified voltage. The first output voltage and the second output voltage are used to determine the difference between the first input voltage and the second input voltage, which further determines the current between the third terminal of the first voltage branch and the third terminal of the second voltage branch. Therefore, the existence of the first feedback branch enables the first voltage and the second voltage to be adjustable voltages, so as to realize the control of the first output voltage and the second output voltage. In this way, when the first input voltage and the second input voltage changes, the first output voltage and the second output voltage can be maintained to be stable, which enables accurate detection of the current in a larger input voltage range.

BRIEF DESCRIPTION OF THE DRAWINGS

One or more embodiments are exemplified by the figures in the corresponding drawings, and these exemplifications do not constitute limitations of the embodiments. Elements with the same reference numerals in the drawings are denoted as similar elements, unless otherwise stated, the figures in the accompanying drawings are not drawn to scale.

DETAILED DESCRIPTION OF ILLUSTRATIVE EMBODIMENTS

In order to make the purposes, technical solutions and advantages of the embodiments of the present application clearer, the technical solutions in the embodiments of the present application will be described clearly and completely below with reference to the drawings in the embodiments of the present application. Obviously, the described embodiments are part of the embodiments of the present application, but not all of the embodiments. Based on the embodiments in the present application, all other embodiments obtained by those of ordinary skill in the art without creative work fall within the protection scope of the present application.

Figure 1:
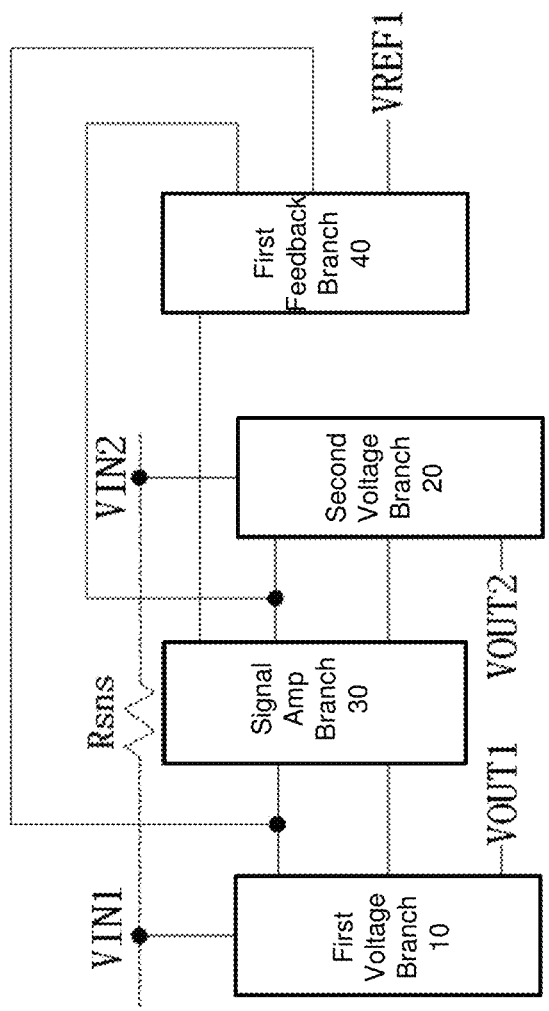
FIG. 1 is a schematic structural diagram of a current detection circuit provided by an embodiment of the present application.

Please refer to FIG. 1, which is a schematic structural diagram of a current detection circuit provided by an embodiment of the present application. As shown in FIG. 1, the current detection circuit includes a first voltage branch 10, a second voltage branch 20, a signal amplification branch 30 and a first feedback branch 40. The first terminal of the signal amplification branch 30 is connected to the first terminal of the first voltage branch 10 and the first terminal of the first feedback branch 40. The second terminal of the signal amplification branch 30 is connected to the second terminal of the first voltage branch 10. The third terminal of the signal amplification branch 30 is connected to the first terminal of the second voltage branch 20 and the second terminal of the first feedback branch 40. The fourth terminal of the signal amplification branch 30 is connected to the second terminal of the second voltage branch 20. The fifth terminal of the signal amplification branch 30 is connected to the third terminal of the first feedback branch 40. The third terminal of the first voltage branch 10 is connected to the first input voltage VIN1. The third terminal of the second voltage branch 10 is connected to the second input voltage VIN2. The fourth terminal of the first feedback branch 40 is used to receive the first reference voltage VREF1.

More specifically, the first feedback branch 40 is configured to generate a feedback signal according to a first voltage generated by the first voltage branch 10, a second voltage generated by the second voltage branch 20 and the first reference voltage VREF1. The signal amplification branch 30 is used for generating a first amplified voltage according to the first voltage and the feedback signal, and generating a second amplified voltage according to the second voltage and the feedback signal. The first voltage branch 10 is used for generating the first voltage and a first output voltage VOUT1 according to the first input voltage VIN1 and the first amplified voltage. The second voltage branch 20 is used for generating the second voltage and the second output voltage VOUT2 according to the second input voltage VIN2 and the second amplified voltage.

The first output voltage VOUT1 is output from the fourth terminal of the first voltage branch 10. The second output voltage VOUT2 is output from the fourth terminal of the second voltage branch 20. The first output voltage VOUT1 and the second output voltage VOUT2 are used to determine the difference between the first input voltage VIN1 and the second input voltage VIN2, which further determines the current between the third terminal of the first voltage branch 10 and the third terminal of the second voltage branch 20. In one embodiment, the current between the third terminal of the first voltage branch 10 and the third terminal of the second voltage branch 20 is the current flowing through the external resistor Rsns.

In this embodiment, when the current detection circuit shown in FIG. 1 operates in a steady state, the first output voltage VOUT1 and the second output voltage VOUT2 will change significantly along with the change of the first input voltage VIN1 and the second input voltage VIN2. By introducing the first feedback branch 40, the first voltage and the second voltage can be obtained, and the corresponding feedback signal can be generated according to the first reference voltage in combination with the first voltage and the second voltage. The feedback signal adjusts the first amplified voltage and the second amplified voltage output by the amplifying branch 30, and then acts on the first voltage branch 10 and the second voltage branch 20 so that the first voltage and the second voltage are closer to the reference voltage VREF1. The first output voltage VOUT1 and the second output voltage VOUT2 are also adjusted accordingly, so as to realize that when the first input voltage VIN1 and the second input voltage VIN2 change, the first output voltage VOUT1 and the second output voltage VOUT2 can also have a relatively stable output. This allows the current to be accurately detected in a wider input voltage range according to the relatively stable first output voltage VOUT1 and second output voltage VOUT2.

Figure 2:
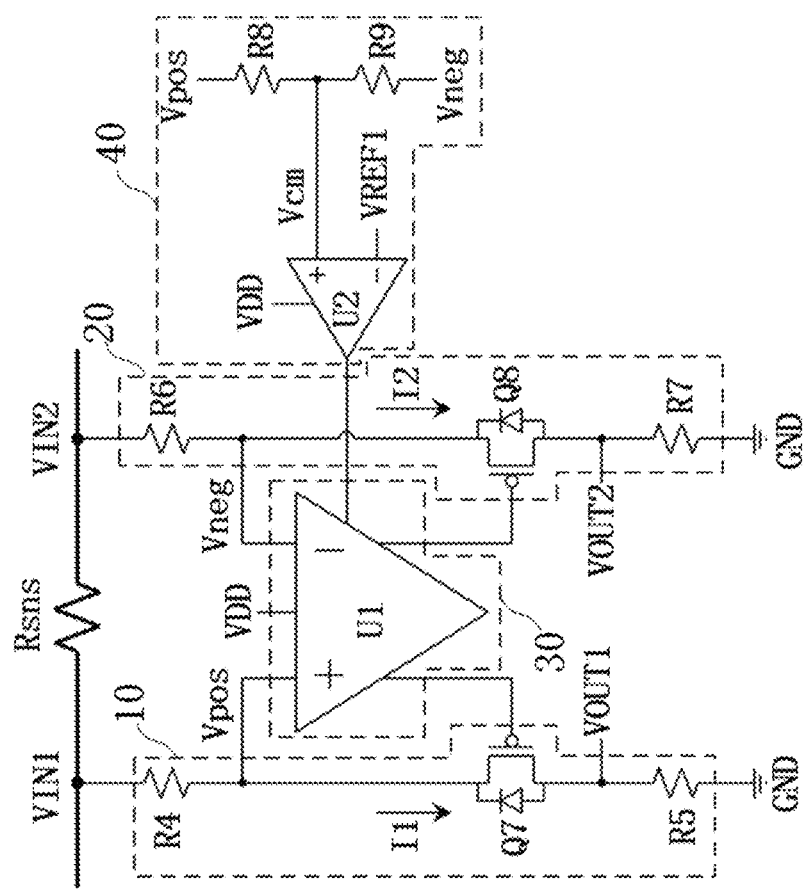
FIG. 2 is a schematic diagram of a circuit structure of a current detection circuit provided by an embodiment of the present application.

As an example, FIG. 2 shows a structure of the first voltage branch 10. As shown in FIG. 2, the first voltage branch 10 includes a fourth resistor R4, a seventh transistor Q7 and a fifth resistor R5. The first terminal of the fourth resistor R4 is connected to the first input voltage VIN1. The second terminal of the fourth resistor R4 is connected to the second terminal of the seventh transistor Q7 and the first terminal of the signal amplification branch 30. The first terminal of the seventh transistor Q7 is connected to the second terminal of the signal amplification branch 30. The third terminal of the seventh transistor Q7 is connected to the first terminal of the fifth resistor R5. The second terminal of the fifth resistor R5 is grounded (GND).

The third terminal of the seventh transistor Q7 is the fourth terminal of the first voltage branch 10. That is, the third terminal of the seventh transistor Q7 is used to output the first output voltage VOUT1.

In this embodiment, taking the seventh transistor Q7 as a PMOS transistor for example, the gate of the PMOS transistor is the first terminal of the seventh transistor Q7. The source of the PMOS transistor is the second terminal of the seventh transistor Q7. The drain of the PMOS transistor is the third terminal of the seventh transistor Q7.

In addition, the seventh transistor Q7 can be implemented as any other suitable switching element, such as triode, insulated gate bipolar transistor (IGBT) device, integrated gate commutated thyristor (IGCT) device, gate turn-off thyristor (GTO) devices, silicon-controlled rectifier (SCR) devices, junction gate field effect transistor (JFET) devices, MOS controlled thyristor (MCT) devices, etc. Meanwhile, the seventh transistor Q7 shown in FIG. 2 may be implemented as a plurality of transistors connected in parallel.

Meanwhile, in this embodiment, the seventh transistor Q7 operates in the variable resistance region. That is, the seventh transistor Q7 can be regarded as being controlled by the voltage difference between the source terminal and the gate terminal of the seventh transistor Q7 (denoted as $V_{SG7}$) The larger the voltage difference $V_{SG7}$ is, the smaller the resistance value of the equivalent resistor of seventh transistor Q7 is. The voltage difference $V_{SG7}$ is negatively correlated with the first amplified voltage output by the signal amplification circuit 30. As a result, the resistance value of the equivalent resistor of the seventh transistor Q7 increases as the first amplified voltage increases.

Then, when the first input voltage VIN1 remains unchanged, if the resistance value of the equivalent resistor of the seventh transistor Q7 increases, the first current I1 flowing through the fourth resistor R4 decreases, and the voltage drop across the fourth resistor R4 decreases. Accordingly, the first voltage Vpos increases. Also, as the first current I1 decreases, the voltage drop across the fifth resistor R5 also decreases and the first output voltage VOUT1 decreases.

When the resistance value of the equivalent resistor of the seventh transistor Q7 decreases, the first current I1 flowing through the fourth resistor R4 increases, and the voltage drop across the fourth resistor R4 increases, and the first voltage Vpos decreases. Moreover, as the first current I1 increases, the voltage drop across the fifth resistor R5 also increases, and the first output voltage VOUT1 increases.

FIG. 2 also shows an example structure of the second voltage branch 20. As shown in FIG. 2, the second voltage branch 20 includes a sixth resistor R6, an eighth transistor Q8 and a seventh resistor R7. The first terminal of the sixth resistor R6 is connected to the second input voltage VIN2. The second terminal of the sixth resistor R6 is connected to the second terminal of the eighth transistor Q8 and the third terminal of the signal amplification branch 30. The first terminal of the eighth transistor Q8 is connected to the fourth terminal of the signal amplification branch 30. The third terminal of the eighth transistor Q8 is connected to the first terminal of the seventh resistor R7. The second terminal of the seventh resistor R7 is grounded (GND).

The third terminal of the eighth transistor Q8 is the fourth terminal of the second voltage branch 20. That is, the third terminal of the eighth transistor Q8 is used to output the second output voltage VOUT2.

In this embodiment, taking the eighth transistor Q8 being a PMOS transistor as an example, the gate of the PMOS transistor is the first terminal of the eighth transistor Q8. The source of the PMOS transistor is the second terminal of the eighth transistor Q8 terminal and the drain of the PMOS transistor is the third terminal of the eighth transistor Q8.

Besides, the eighth transistor Q8 can be implemented as any other suitable switching elements, such as triode, insulated gate bipolar transistor (IGBT) device, integrated gate commutated thyristor (IGCT) device, gate turn-off thyristor (GTO) devices, silicon-controlled rectifier (SCR) devices, junction gate field effect transistor (JFET) devices, MOS controlled thyristor (MCT) devices, etc. Meanwhile, the eighth transistor Q8 shown in FIG. 2 may be implemented as a plurality of transistors connected in parallel.

Meanwhile, in this embodiment, the eighth transistor Q8 also operates in the variable resistance region. That is, the eighth transistor Q8 can be regarded as being controlled by the voltage difference between the source terminal and the gate terminal of the eighth transistor Q8 (denoted as $V_{SG8}$). The larger the voltage difference $V_{SG8}$ is, the smaller the resistance value of the equivalent resistor of the eighth transistor Q8 is. The voltage difference $V_{SG8}$ is negatively correlated to the second amplified voltage output by the signal amplification circuit 30. Consequently, the resistance value of the equivalent resistor of the eighth transistor Q8 increases with the increase of the second amplified voltage.

Then, when the second input voltage VIN2 remains unchanged, if the resistance value of the equivalent resistor of the eighth transistor Q8 increases, the second current I2 flowing through the sixth resistor R6 decreases and voltage drop across the sixth resistor R6 decreases, and the second voltage Vneg increases. Also, as the second current I2 decreases, the voltage drop across the seventh resistor R7 also decreases and the second output voltage VOUT2 decreases.

When the resistance value of the equivalent resistor of the eighth transistor Q8 decreases, the second current I2 flowing through the sixth resistor R6 increases. The voltage drop across the sixth resistor R6 increases, and the voltage Vneg decreases. Moreover, in response to the increase of the second current I2, the voltage drop across the seventh resistor R7 also increases. As a result, the second output voltage VOUT2 increases.

FIG. 2 also shows an example structure of the first feedback branch 40. As shown in FIG. 2, the first feedback branch 40 includes an eighth resistor R8, a ninth resistor R9 and a comparator U2. The first terminal of the eighth resistor R8 is connected to the first terminal of the signal amplification branch 30. The second terminal of the eighth resistor R8 is connected to the first terminal of the ninth resistor R9 and the first input terminal of comparator U2. The second terminal of the ninth resistor R9 is connected to the third terminal of the signal amplification branch 30. The second input terminal of the comparator U2 is used to receive the first reference voltage VREF1. The output terminal of U2 is connected to the fifth terminal of the signal amplification branch 30. The power terminal of the comparator U2 is connected to the power supply voltage VDD.

Specifically, the first terminal of the eighth resistor R8 is used to receive the first voltage Vpos, and the second terminal of the ninth resistor R9 is used to receive the second voltage Vneg. The eighth resistor R8 and the ninth resistor R9 can use large resistors with the same resistance value to calculate the common mode value (average) Vcm of the first voltage Vpos and the second voltage Vneg, and then feed the common mode value Vcm to the first input terminal of the comparator U2 so that the comparator U2 outputs a corresponding feedback signal. The first input terminal of the comparator U2 may be a non-inverting input terminal, and the second input terminal of the comparator U2 may be an inverting input terminal.

In this embodiment, the first feedback branch 40 is used to adjust the common mode value Vcm to the desired first reference voltage VREF1. The first reference voltage VREF1 can be used to track the first input voltage VIN1, the second input voltage VIN2, or the average value of the first input voltage VIN1 and the second input voltage VIN2, and maintain a fixed voltage difference therewith. Therefore, the common mode value Vcm will always be lower than the first input voltage VIN1, the second input voltage VIN2 or the average value of the first input voltage VIN1 and the second input voltage VIN2 by a constant voltage difference. For example, in one embodiment, the first reference voltage VREF1 may be designed to be always 250 mV lower than the second input voltage VIN2. That is, VREF1=VIN2−250 mV. Therefore, when VIN2=20V, Vcm=VREF1=19.75V, and when VIN2=3V, Vcm=VREF1=2.75V.

In one embodiment, the signal amplification branch 30 includes an amplifier U1. The non-inverting input terminal of the amplifier U1 is the first terminal of the signal amplification branch 30. The inverting input terminal of the amplifier U1 is the third terminal of the signal amplification branch 30. The first output terminal of the amplifier U1 is the second terminal of the signal amplification branch 30. The second output terminal of the amplifier U1 is the fourth terminal of the signal amplification branch 30. The feedback signal input terminal of the amplifier U1 is the fifth terminal of the signal amplification branch 30. At the same time, the power input terminal of the amplifier U1 is connected to the supply voltage VDD.

The operation principle of the circuit shown in FIG. 2 will be described below.

Among them, the current detection circuit is used to detect the current flowing through the external resistor Rsns. The current detection circuit allows accurate current detection over a wide voltage range of the first input voltage VIN1 and the second input voltage VIN2. The current detection circuit detects the first input voltage VIN1 by converting the first input voltage VIN1 into the first current I1 flowing through the fourth resistor R4. That is, I1=(VIN1−Vpos)/r4. r4 is the resistance value of the fourth resistor R4. Then, the first current I1 flowing through the fifth resistor R5 is used to generate the first output voltage VOUT1. VOUT1=r5× (VIN1−Vpos)/r4. r5 is the resistance value of the fifth resistor R5 Likewise, the current detection circuit detects the second input voltage VIN2 by converting the second input voltage VIN2 into a second current I2 flowing through the sixth resistor R6. That is, I2=(VIN2−Vneg)/r6. r6 is the resistance value of the sixth resistor R6. Then, the second current I2 flowing through the seventh resistor R7 is used to generate the second output voltage VOUT2=r7×(VIN2− Vneg)/r6. r7 is the resistance value of the seventh resistor R7. At the same time, amplifier U1 forces Vpos=Vneg. As a result, when the ratio of the fifth resistance to the fourth resistance is equal to the ratio of the seventh resistance to the sixth resistance, the input voltage difference between the first input voltage VIN1 and the second input voltage VIN2 is scaled up by the resistance ratio, e.g. VOUT1−VOUT2= (r5/r4)×(VIN1−VIN2)=(r7/r6)×(VIN1−VIN2).

The common mode value Vcm of the first voltage Vpos and the second voltage Vneg is defined as the average voltage of the first voltage Vpos and the second voltage Vneg, i.e. Vcm=(Vpos+Vneg)/2. For keeping the current detection circuit to operate properly, the common mode value Vcm must be lower than the first input voltage VIN1 and the second input voltage VIN2. Since the amplifier U1 is powered by the supply voltage VDD, the common mode value Vcm also needs to be lower than the supply voltage VDD.

Figure 3:
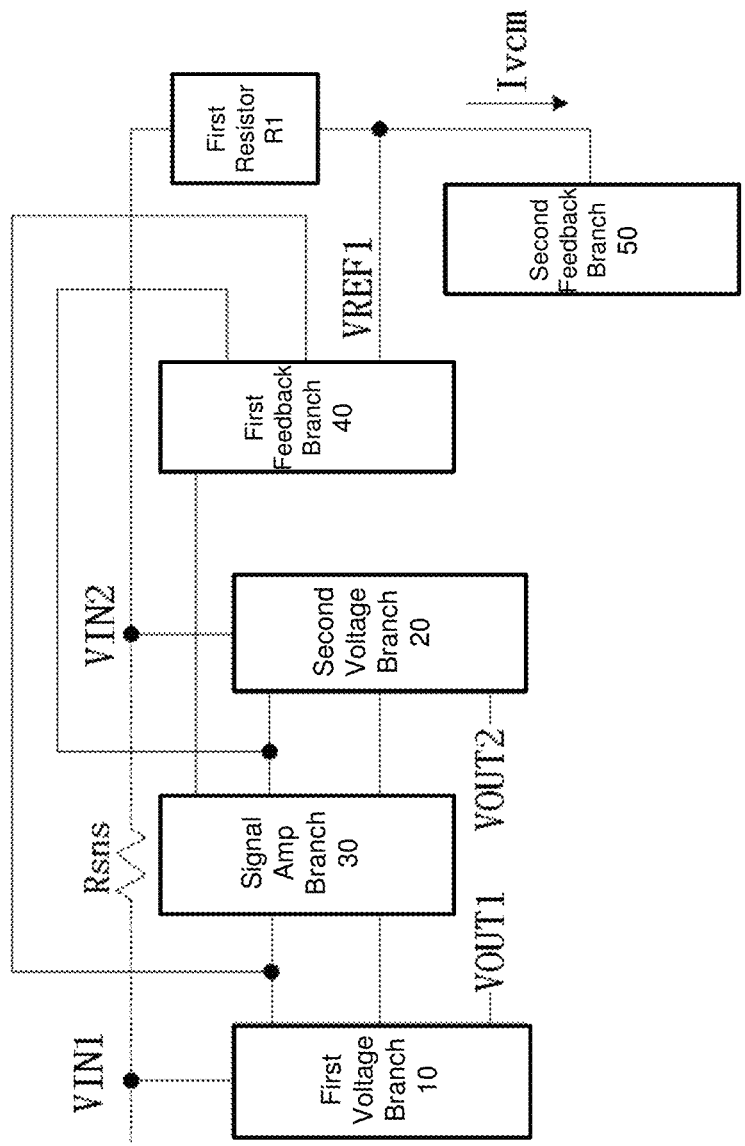
FIG. 3 is a schematic structural diagram of a current detection circuit provided by another embodiment of the present application.

In one embodiment, as shown in FIG. 3, the current detection circuit further includes a second feedback branch 50 and a first resistor R1. The first terminal of the second feedback branch 50 is connected to the first terminal of the first resistor R1 and the fourth terminal of the first feedback branch 40. The second terminal of the first resistor R1 is connected to the second input voltage VIN2. The second feedback branch 50 is used to provide the first feedback current Ivcm to generate a voltage drop across the first resistor R1, which determines the first reference voltage VREF1 according to the voltage drop on R1 and the second input voltage VIN2.

Specifically, the voltage drop across the first resistor R1 is the product of the resistance value of the first resistor R1 and the first feedback current Ivcm. The first reference voltage VREF1 is the difference between the second input voltage VIN2 and the voltage drop across the first resistor R1. By employing the second feedback branch 50, the first reference voltage VREF1 can be adjusted through the first feedback current Ivcm, so that the first reference voltage VREF1 is an adjustable voltage.

In this embodiment, the voltage difference between the first reference voltage VREF1 and the second input voltage VIN2 is realized by the first resistor R1 and the first feedback current Ivcm. That is, VIN2−r1×Ivcm=VREF1. r1 is the resistance value of the first resistor R1. When the first feedback current is a constant value (such as a constant current source), such a circuit setting can ensure that the first reference voltage VREF1 is always lower than the second input voltage VIN2 by a fixed voltage value r1×Ivcm. The current detection circuit compares the detected common mode value Vcm with the first reference voltage VREF1 through the comparator U2 and outputs a feedback signal to adjust the signal amplification circuit 30 to make the average value of the first voltage Vpos and the second voltage Vneg (that is, the common mode value Vcm) approach the first reference voltage VREF1, thereby stabilizing the voltage drop between the first voltage Vpos and the first input voltage VIN1, and the voltage drop between the second voltage Vneg and the second input voltage VIN2, which realizes the purpose of controlling the voltage drop across the fourth resistor R4 and the voltage drop across the sixth resistor R6. As mentioned above, when the voltage drops across the fourth resistor R4 and the sixth resistor R6 are relatively stable, the voltage drops across the fifth resistor R5 and the seventh resistor R7 are also relatively stable, which help to maintain the first output voltage and the second output voltage relatively stable.

Taking the circuit structure shown in FIG. 2 as an example, the first reference voltage VREF1 shown in FIG. 2 is obtained from the second input voltage VIN2, the first resistor R1 and the first feedback current Ivcm. That is VREF1=VIN2−r1×Ivcm. The first feedback current Ivcm may take a constant value so that r1×Ivcm is equal to 250 mV. Specifically, the first reference voltage VREF1 comes from the second input voltage VIN2, and the first reference voltage VREF1 is equal to the common mode value Vcm in a steady state. That is, Vcm=VIN2−250 mV. Assuming Rsns=10 mΩ and the ratio of r5 to r4 is 5:1, when the current flowing through the external resistor Rsns is 1 A, VRsns=VIN1−VIN2=10 mV. VRsns is the voltage across the external resistor Rsns. When VIN2=5V, VIN1 will be 5.01V, and Vpos=Vneg=VIN2−250 mV=4.75V. In a steady state, the output of the current sense circuit will be VOUT1= (5.01−4.75)×5=1.30V and VOUT2=(5−4.75)×5=1.25V. Therefore, the output voltage difference (VOUT1−VOUT2)=50 mV, which is 5 times the input voltage difference (VIN1−VIN2). And when the input voltage rises to VIN2=20V, keeping the current equal to 1 A, VIN1 will be 20.01V. Vpos=Vneg=19.75V. Although the input voltage increases significantly, the output of the current detection circuit will remain VOUT1=1.30V and VOUT2=1.25V, and will not be affected by the input voltages VIN1 and VIN2. A stable output voltage value facilitates more accurate current sensing. At the same time, (VOUT1−VOUT2)=50 mV, which is still 5 times the input voltage difference (VIN1−VIN2).

It can be seen that, through the combination of the first feedback branch 40 and the second feedback branch 50, the first reference voltage VREF1 can be adjusted. When the first reference voltage VREF1 varies with the second input voltage VIN2, and keeps the voltage difference constant, the voltage drop between the first voltage Vpos and the first input voltage VIN1, and the voltage drop between the second voltage Vneg and the second input voltage VIN2 are also kept constant, such that the control of the first output voltage VOUT1 and the second output voltage VOUT2 is achieved by adjusting the first current I1 and the second current I2. Moreover, since the voltage drop between the common mode value Vcm and the second output voltage VOUT2 can be kept fixed, it can be achieved that when the first input voltage VIN1 and/or the second output voltage VIN2 changes, the first output voltage VOUT1 and the second output voltage VOUT2 are stable. As a result, this circuit maximizes the input voltage range in which the current detection circuit can operate.

In one embodiment, the second feedback branch 50 may be implemented by a fixed current source. In this case, the first feedback current is a fixed current output by a fixed current source. That is, Ivcm and Ivcm×r1 are fixed values. At this time, the voltage drop between the second input voltage VIN2 and the first reference voltage is kept constant, so that the output voltages VOUT1 and VOUT2 do not change with the changes of the input voltages VIN1 and VIN2.

Figure 4:
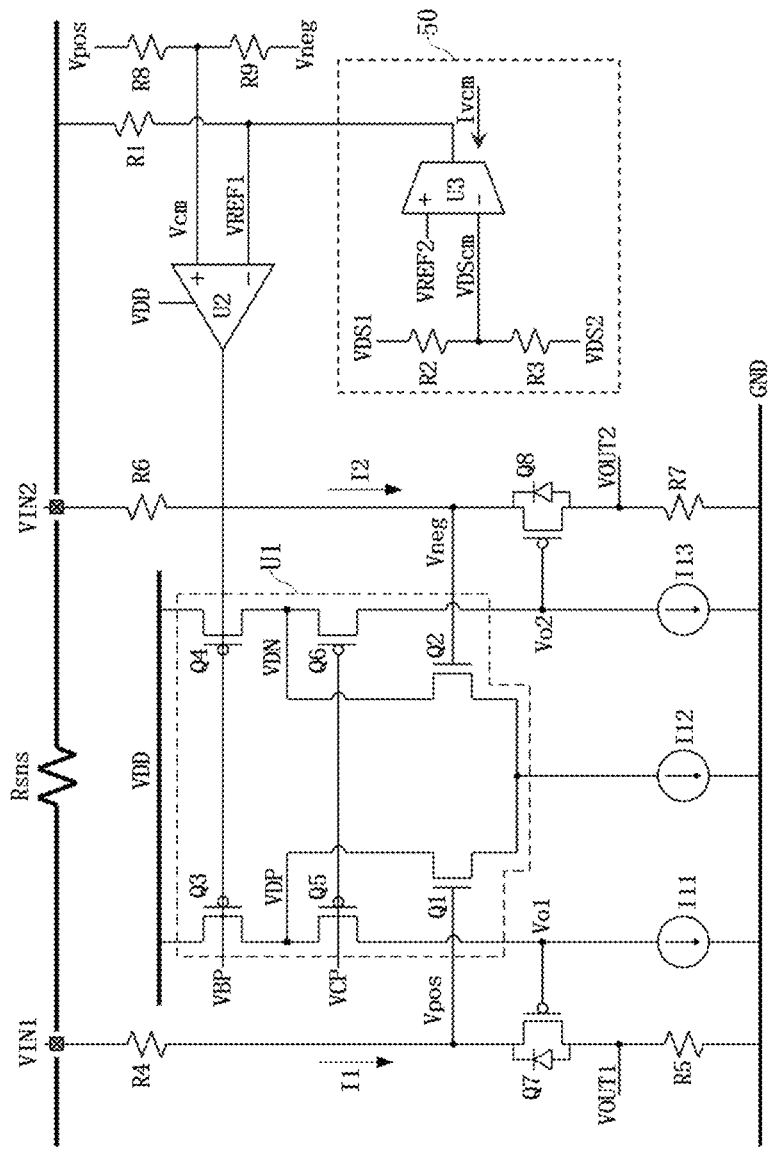
FIG. 4 is a schematic diagram of a circuit structure of a current detection circuit provided by another embodiment of the present application.

In one embodiment, as shown in FIG. 4, the signal amplification branch 30 includes an amplifier U1. The amplifier U1 includes a first transistor Q1 and a second transistor Q2. The first terminal of the first transistor Q1 is the first terminal of the signal amplification branch 30 and the first terminal of the second transistor Q2 is the third terminal of the signal amplification branch 30. The second feedback branch 50 includes a first transconductance amplifier U3, a second resistor R2 and a third resistor R3.

The second terminal of the first transconductance amplifier U3 is connected to the first terminal of the second resistor R2 and the first terminal of the third resistor R3. The third terminal of the first transconductance amplifier U3 is used for receiving the second reference voltage VREF2. The second terminal and the third terminal of the first transconductance amplifier U3 comprise the differential inputs of the first transconductance amplifier U3. The first terminal of the first transconductance amplifier U3 is connected to the first terminal of the first resistor R1 and the fourth terminal of the first feedback branch 40. The second terminal of the second resistor R2 is used for receiving a first detection voltage VDS1 representing the voltage difference between the third terminal and the second terminal of the transistor Q1. The second terminal of the third resistor R3 is used to receive the second detection voltage VDS2 representing the voltage difference between the third terminal and the second terminal of the second transistor Q2.

The first detection voltage VDS1 is a voltage corresponding to the voltage difference between the third terminal and the second terminal of the first transistor Q1, which can be set according to actual application conditions, which are not specifically described in the embodiment of the present application. For example, in one embodiment, the first detection voltage VDS1 is the product of the voltage difference between the third terminal and the second terminal of the first transistor Q1 and a fixed coefficient. For another example, in another embodiment, the first detection voltage VDS1 is the difference between the voltage difference between the third terminal and the second terminal of the first transistor Q1 and a fixed value. The specific configuration of the second detection voltage VDS2 and the first detection voltage VDS1 are can be easily understood by those skilled in the art, and will not be repeated herein.

Specifically, the first transconductance amplifier U3 is an amplifier that converts an input differential voltage into an output current. The first common mode value VDScm of the first detection voltage VDS1 and the second detection voltage VDS2 is defined as the average voltage of the first detection voltage VDS1 and the second detection voltage VDS2. That is, $VDScm=(VDS1+VDS2)/2$.

Meanwhile, in this embodiment, taking both the first transistor Q1 and the second transistor Q2 as NMOS transistors for example, the gate of the NMOS transistor is the first terminal of the transistor Q1 (or the second transistor Q2). The source of the NMOS transistor is the second terminal of the first transistor Q1 (or the second transistor Q2). The drain of the NMOS transistor is the third terminal of the first transistor Q1 (or the second transistor Q2).

Besides, the first transistor Q1 and the second transistor Q2 can be implemented as any other suitable switching elements, such as triodes, insulated gate bipolar transistor (IGBT) devices, integrated gate commutated thyristor (IGCT) devices, Gate Off Thyristor (GTO) devices, Silicon Controlled Rectifier (SCR) devices, Junction Gate Field Effect Transistor (JFET) devices, MOS Controlled Thyristor (MCT) devices, etc. Meanwhile, the first transistor Q1 and the second transistor Q2 shown in FIG. 4 may be implemented as a plurality of transistors connected in parallel.

In one embodiment, the amplifier U1 further includes a third transistor Q3, a fourth transistor Q4, a fifth transistor Q5, a sixth transistor Q6, a first current source I11, a second current source I12 and a third Current source I13. The first terminal of the third transistor Q3 is connected to the first terminal of the fourth transistor Q4 and the third terminal of the first feedback branch 40. The second terminal of the third transistor Q3 is connected to the second terminals of the fourth transistor Q4 and the supply voltage VDD. The third terminals of the third transistor Q3 is connected to the second terminal of the fifth transistor Q5 and the third terminal of the first transistor Q1. The second terminal of the first transistor Q1 is connected to the second terminal of the second transistor Q2 and the negative terminal of the second current source I12. The first terminal of the fifth transistor Q5 and the first terminal of the sixth transistor Q6 are both used for receiving a third voltage VCP. The third terminal of the fifth transistor Q5 is connected to the second terminal of the first voltage branch 10 and the negative terminal of the first current source I11. The third terminal of the fourth transistor Q4 is connected to the second terminal of the sixth transistor Q6 and the third terminal of the second transistor Q2. The third terminal of the sixth transistor Q6 is connected to the second terminal of the second voltage branch 20 and the negative terminal of the third current source I13. The positive terminal of the first current source I11, the positive terminal of the second current source I12 and the positive terminal of the third current source I13 are all grounded.

In this embodiment, the third transistor Q3, the fourth transistor Q4, the fifth transistor Q5 and the sixth transistor Q6 are all PMOS transistors. The gate of the PMOS transistor is the first terminal of the third transistor Q3 (or the first terminals of the fourth transistor Q4, the fifth transistor Q5, or the sixth transistor Q6). The source of the PMOS transistor is the second terminal of the third transistor Q3 (or the fourth transistor Q4, the fifth transistor Q5, or the sixth transistor Q6). The drain of the PMOS transistor is the third terminal of the third transistor Q3 (or the fourth transistor Q4, or the fifth transistor Q5, or the sixth transistor Q6).

Besides, the third transistor Q3, the fourth transistor Q4, the fifth transistor Q5 and the sixth transistor Q6 can also be implemented as any other suitable switching elements, such as triodes, insulated gate bipolar transistors (IGBT) devices, integrated gate commutated thyristor (IGCT) devices, gate turn-off thyristor (GTO) devices, silicon controlled rectifier (SCR) devices, junction gate field effect transistor (JFET) devices, MOS controlled thyristor (MCT) devices, etc. Meanwhile, the third transistor Q3, the fourth transistor Q4, the fifth transistor Q5 and the sixth transistor Q6 shown in FIG. 4 may be implemented as a plurality of transistors connected in parallel.

The operation principle of the circuit shown in FIG. 4 will be described below.

In a steady state, the amplifier U1 adjusts the first voltage Vpos to be equal to the second voltage Vneg. If the first voltage Vpos is greater than the second voltage Vneg, the current flowing through the first transistor Q1 will increase, thereby causing the first amplified voltage Vo1 output by the amplifier U1 to drop. As a result, the seventh transistor Q7 pulls down the first voltage Vpos and returns to the first voltage Vpos equal to the second voltage Vneg. Likewise, if the second voltage Vneg is greater than the first voltage Vpos, more current will flow through the second transistor Q2, thereby causing the second amplified voltage Vo2 output by the amplifier U1 to drop. As a result, the seventh transistor Q7 pulls down the second voltage Vpos and returns to the first voltage Vpos equal to the second voltage Vneg.

As mentioned above, the beneficial effect of this setting is that the common mode value Vcm of the first voltage Vpos and the second voltage Vneg is adjusted to be equal to the first reference voltage VREF1 by the first feedback branch 40. When the common mode value Vcm is greater than the first reference voltage VREF1, the feedback signal VBP output by the comparator U2 rises. The drain voltage of the third transistor Q3 decreases as the voltage difference between the source and the gate of the third transistor Q3 (denoted by as VsG3) decreases. The drain voltage of the fourth transistor Q4 decreases as the voltage difference between its source and gate (denoted as VsG4) decreases. As a result, both the first amplified voltage Vo1 and the second amplified voltage Vo2 decrease, thereby causing the common mode value Vcm of the first voltage Vpos and the second voltage Vneg to decrease to a level equal to the first reference voltage VREF1.

When the variation range of the first input voltage VIN1 and the second input voltage VIN2 is relatively large, a fixed Ivcm is used to keep the difference Ivcm×r1 between the second input voltage VIN2 and the first reference voltage VREF1 constant, which in turn keeps the output voltages VOUT1 and VOUT2 stable. However, when the supply voltage VDD is less than the second input voltage VIN2, the current detection circuit may not operate normally under the fixed difference Ivcm×r1 between the second input voltage VIN2 and the first reference voltage VREF1. In this case, a variable Ivcm needs to be used to dynamically adjust the difference between the second input voltage VIN2 and the first reference voltage VREF1 to keep the current detection circuit operating normally.

Specifically, when the supply voltage VDD is less than the second input voltage VIN2, for example, VDD=19.0V and VIN2=20V, the current detection circuit will not operate at a fixed $\Delta v$=250 mV. It is assumed that the difference between the second input voltage VIN2 the first reference voltage VREF1 is a constant $\Delta v$. The threshold voltage Vth of the first transistor Q1 and the second transistor Q2 is 0.7V, and the saturated drain-source voltages of the first transistor Q1, the second transistor Q2, the third transistor Q3 and the fourth transistor Q4 Vdssat is 0.2V. When $\Delta v$=250 mV, that is, Vpos=Vneg=19.75V, the differential input transistor pair (including the first transistor Q1 and the second transistor Q2) cannot operate in a saturation mode as the source voltage of the first transistor Q1 and the second transistor Q2 will be at Vpos−Vth=19.05V, which is higher than the supply voltage VDD. Even if the threshold voltages of the first transistor Q1 and the second transistor Q2 are increased to 1.0V by increasing the body effect of the first transistor Q1 and the second transistor Q2, the source voltage of the first transistor Q1 and the second transistor Q2 drops to 18.75V. Although the source voltages of the first transistor Q1 and the second transistor Q2 are smaller than the supply voltage VDD, the voltage difference between the source voltage of the first transistor Q1 and the supply voltage VDD is still smaller than the sum of the saturated drain source voltage Vdssat of the first transistor Q1 and the saturated drain-source voltage Vdssat of the third transistor Q3. At this time, the voltage difference between the source voltage of the second transistor Q2 and the supply voltage VDD is still smaller than the sum of the saturated drain-source voltages Vdssat of the second transistor Q2 and the saturated drain-source voltage Vdssat of the fourth transistor Q4. Therefore, one or more of the first transistor Q1, the second transistor Q2, the third transistor Q3 and the fourth transistor Q4 will enter the triode region (e.g., the variable resistance region), so that the current detection circuit cannot operate properly.

Furthermore, for transistors, the threshold voltage and saturation drain-source voltage Vdssat vary significantly with the process and operating temperatures, making it difficult to operate under various conditions simply by increasing the threshold voltage. Moreover, at this time, the first reference voltage VREF1 is 19.75V and is also greater than the power supply voltage VDD, so the first feedback branch 40 may fail because the first reference voltage VREF1 is greater than the power supply voltage VDD. In this case, it is necessary to configure the second feedback branch 50 to generate a variable Ivcm to dynamically adjust the difference between the second input voltage VIN2 and the first reference voltage VREF1, so as to keep the current detection circuit functioning properly.

Furthermore, by configuring the second feedback branch 50, the first detection voltage VDS1 representing the drain-source voltage difference of the first transistor Q1 (e.g., the voltage difference between the second terminal and the third terminal of the first transistor Q1) and the second detection voltage VDS2 representing the drain-source voltage difference of the second transistor Q2 (e.g., the voltage difference between the second terminal and the third terminal of the second transistor Q2) can be adjusted to a level equal to the second reference voltage VREF2. The second reference voltage VREF2 can be set to ensure that when the first detection voltage VDS1 and the second detection voltage VDS2 are greater than or equal to the second reference voltage VREF2, the drain-source voltage difference of the first transistor Q1 is greater than its saturated drain-source voltage Vdssat, and the drain-source voltage difference of the second transistor Q2 is also greater than its saturated drain-source voltage Vdssat. This ensures that the first transistor Q1 and the second transistor Q2 both remain saturated even when the first input voltage VIN1 or the second input voltage VIN2 increases above the supply voltage VDD. At the same time, the voltage VCP is biased by using a conventional folded cascode architecture. The voltage VCP is the driving voltage of the fifth transistor Q5 and the sixth transistor Q6. This way, as long as the current detection circuit operates and regulates the first amplified voltage Vo1 and the second amplified voltage Vo2, the first transistor Q1 and the second transistor Q2 are kept in a saturated conduction mode.

Specifically, the second feedback branch 50 is configured to receive the first detection voltage VDS1 and the second detection voltage VDS2, and process the first detection voltage VDS1 and the second detection voltage VDS2 to obtain the first common mode value VDScm, which represent the average drain-source voltage difference of the first transistor Q1 and the second transistor Q2. The difference between the second reference voltage VREF2 and the first common mode value VDScm is $\Delta$Vds, and $\Delta$Vds determines the first feedback current Ivcm output by the first transconductance amplifier U3. The first feedback current Ivcm determines the value of the difference $\Delta v$ between the second input voltage VIN2 and the first reference voltage VREF1. A larger first feedback current Ivcm will increase $\Delta v$, thereby reducing the first reference voltage VREF1, which in turn reduces the common mode voltage Vcm of the first voltage Vpos and the second voltage Vneg. The transconductance amplifier may be configured such that when the difference $\Delta$Vds between the second reference voltage VREF2 and the first common mode value VDScm is smaller than a preset threshold Vset, the first feedback current Ivcm output by the second feedback branch 50 will remain unchanged. The preset current Iset keeps the difference $\Delta v$ between the second input voltage VIN2 and the first reference voltage VREF1 constant. When the difference $\Delta$Vds between the second reference voltage VREF2 and the first common mode value VDScm is greater than the preset threshold Vset, the first feedback current Icvm output by the second feedback branch 50 will continue to increase. That is, the $\Delta v$ will continue to increase. This means under this condition, the first reference voltage VREF1 is continuously lowered while the second input voltage VIN2 remains unchanged. In this way, with the continuous decrease of VREF1, the common mode voltage Vcm of the first voltage Vpos and the second voltage Vneg is continuously decreased, thereby increasing the first common mode value VDScm until the difference ΔVds between the second reference voltage VREF2 and the first common mode value VDScm reaches a new equilibrium point near the preset threshold.

In one embodiment, the output saturation characteristic of the first transconductance amplifier can also be used to realize the nonlinear relationship between the feedback current Icvm and the difference ΔVds between the second reference voltage VREF2 and the first common mode value VDScm (that is, the first transconductance differential input of amplifier U3).

Figure 5:
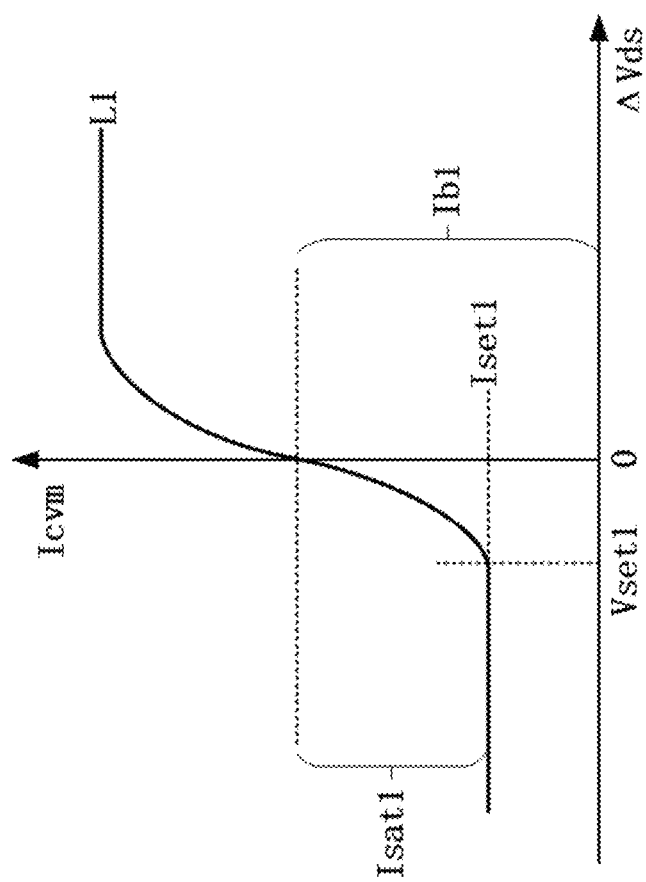
FIG. 5 is a schematic diagram of input and output characteristics of a first transconductance amplifier provided by an embodiment of the present application.

Please refer to FIG. 5, which is a schematic diagram of the input and output characteristics of the first transconductance amplifier U3. As shown in FIG. 5, the horizontal axis represents the difference ΔVds between the second reference voltage VREF2 and the first common mode value VDScm, and the vertical axis represents the first feedback current Icvm. It can be seen from FIG. 5 that the first feedback current Icvm output by the first transconductance amplifier includes two parts, a first DC bias current Ib1 and a first AC output current L1. The first DC bias current Ib1 can be provided by the first transconductance amplifier or provided by an external current source in parallel. If the first feedback current Icvm only includes the first AC output current L1, the first feedback current Icvm output by the first transconductance amplifier crosses zero when the differential input voltage (i.e. the difference ΔVds) of the first transconductance amplifier is 0. When the differential input voltage is less than the saturation threshold (e.g., Vset1), the AC output current L1 reaches the saturation value −Isat1. Similarly, when the differential input voltage is greater than the saturation threshold (e.g., Vset1), the AC output current L1 reaches the saturation value Isat1. In this embodiment, the second reference voltage VREF2 can be reasonably configured so that when the first common mode value VDScm reaches the target value, the differential input voltage of the first transconductance amplifier U3 is near the saturation voltage Vset1. In this way, when ΔVds increases from Vset1, the first feedback current Icvm increases rapidly, and when ΔVds decreases from Vset1, the first feedback current Icvm remains unchanged. Here, the gain of the first transconductance amplifier (that is the slope at the zero-crossing point of the AC output current L1 in the first feedback current Icvm output by the first transconductance amplifier shown in the figure) needs to be as large as possible to achieve a fast closed-loop control of the difference Δv between the two input voltages VIN2 and the first reference voltage VREF1. When the gain of the first transconductance amplifier is large enough, the saturation threshold of the input differential voltage is close to 0, and the equilibrium point for closed-loop control of ΔVds is also close to ΔVds=0. That is, the second reference voltage VREF2 and the first common mode value VDScm are equal. Meanwhile, when the transconductance amplifier is saturated, the setting of the fixed first feedback current Icbm can be achieved by controlling the first DC bias current Ib1, where Iset1=Ib1−Isat1.

For example, in one embodiment, it is assumed that the voltage VCP is biased so that the drain-source voltages of the first transistor Q1 and the second transistor Q2 are both 0.25V. That is, the voltage VDN and the voltage VDP are both the supply voltages VDD minus 0.25 v, which are 18.75V.

Continue to assume the threshold voltage Vth of the first transistor Q1 and the second transistor Q2 to be 0.7V, and the saturated drain sources voltage Vdssat of the first transistor Q1, the second transistor Q2, the third transistor Q3 and the fourth transistor Q4 are 0.2V. When the second input voltage VIN2 is 20V and the power supply voltage VDD is 19.0V, without configuring second feedback branch 50, the drain-source voltages of the first transistor Q1 and the second transistor Q2 are both about 0 v.

By configuring the second feedback branch 50, the drain-source voltage difference between the first transistor Q1 and the second transistor Q2 is directly input to the second feedback branch 50 as the first detection voltage VDS1 and the second detection voltage VDS2. The second reference voltage VREF2 is set to 0.25V. The second feedback branch 50 will reduce the first reference voltage VREF1 until the first common mode value VDScm of the first transistor Q1 and the second transistor Q2 is 0.25V and greater than the saturated drain-source voltage Vdssat of the first transistor Q1 and the second transistor Q2. At this time, the source voltage of the first transistor Q1, the source voltage of the second transistor Q2 and the common mode value Vcm will be reduced to VDP−VREF2=18.5V, VDN−VREF2=18.5V and VDP−VREF2+Vth=19.2V respectively to ensure that the first transistor Q1 and the second transistor Q2 maintain in the saturated conduction state when the second input voltage VIN2 is greater than the supply voltage VDD.

Meanwhile, in this embodiment, when the second input voltage VIN2 is 5V and is less than the supply voltage VDD, and the first common mode value VDScm of the first transistor Q1 and the second transistor Q2 is greater than the second reference voltage VREF2, the second feedback branch 50 will be saturated and will not continue to pull down the first reference voltage VREF1. The first reference voltage VREF1 will remain around at least 4.75V. Therefore, according to the design, the minimum fixed voltage difference between the first reference voltage VREF1 and the second input voltage VIN2 is maintained at 250 mV.

In this embodiment, by configuring the second feedback branch 50, an adaptive control loop of the common mode value Vcm of the first voltage Vpos and the second voltage Vneg is implemented to dynamically adjust the common mode value Vcm according to the operating conditions of the current detection circuit. The current detection circuit can keep the current detection circuit operating properly and maintain the input voltage working range and detection accuracy of the current detection circuit to the maximum extent under the condition that the supply voltage VDD is greater than the first input voltage VIN1, and under the condition that the supply voltage VDD is smaller than the first input voltage VIN1.

It should be noted that the hardware structure of the current detection circuit shown in FIG. 2 or FIG. 4 is only an example, and the current detection circuit may have more or less components than those shown in the figures, and two or more components may be combined, or may have different component configurations, the various components shown in the figures may be implemented in hardware, software, or hardware and including one or more signal processing and/or application specific integrated circuits, implemented in a combination of software.

For example, in the embodiment of the present application, the amplifier U1 adopts a folded cascode structure, while in other embodiments, the amplifier U1 may also adopt other types of differential amplifiers. This is not specifically limited.

Figure 6:
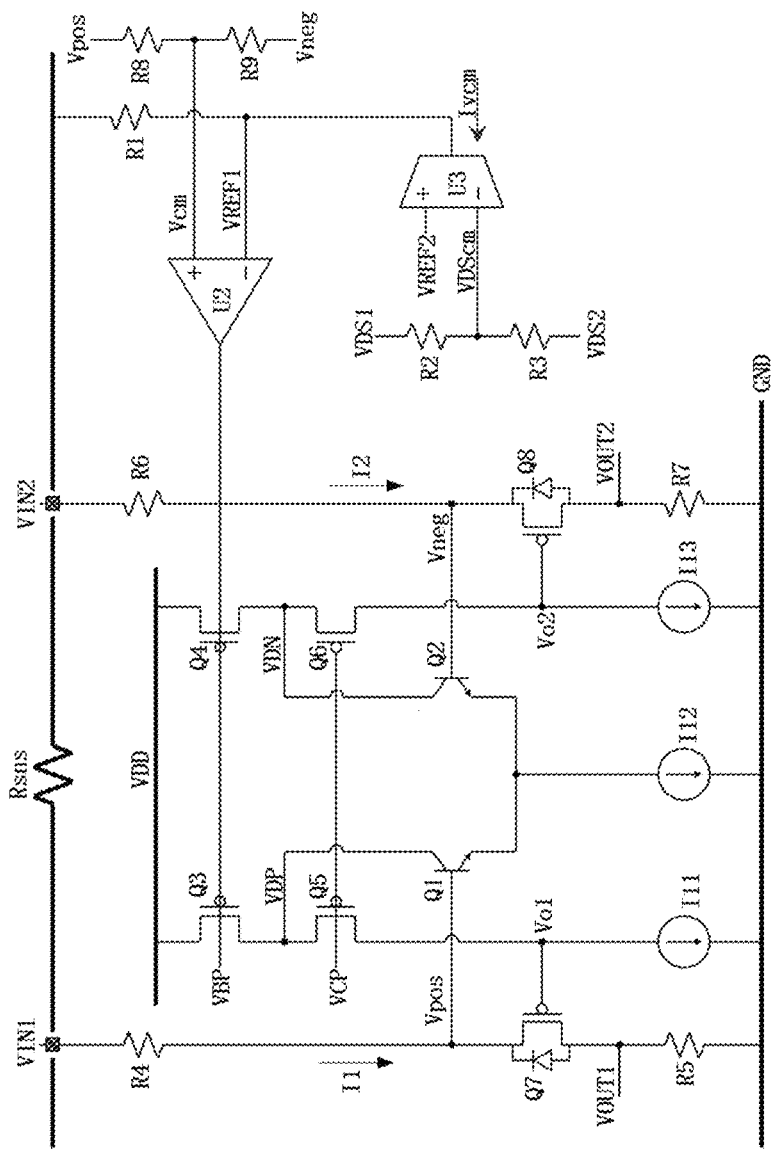
FIG. 6 is a schematic diagram of a circuit structure of a current detection circuit provided by another embodiment of the present application.

For another example, in one embodiment, as shown in FIG. 6, the first transistor Q1 and the second transistor Q2 are implemented by bipolar devices (BJTs). In this embodiment, the second feedback branch 50 is used to adjust the average emitter-collector voltage of the first transistor Q1 and the second transistor Q2, so that the first transistor Q1 and the second transistor Q2 remain in the linear region. The specific implementation process is similar to the above-mentioned embodiment, which is within the scope of being easily understood by those skilled in the art and will not be repeated herein.

Figure 7:
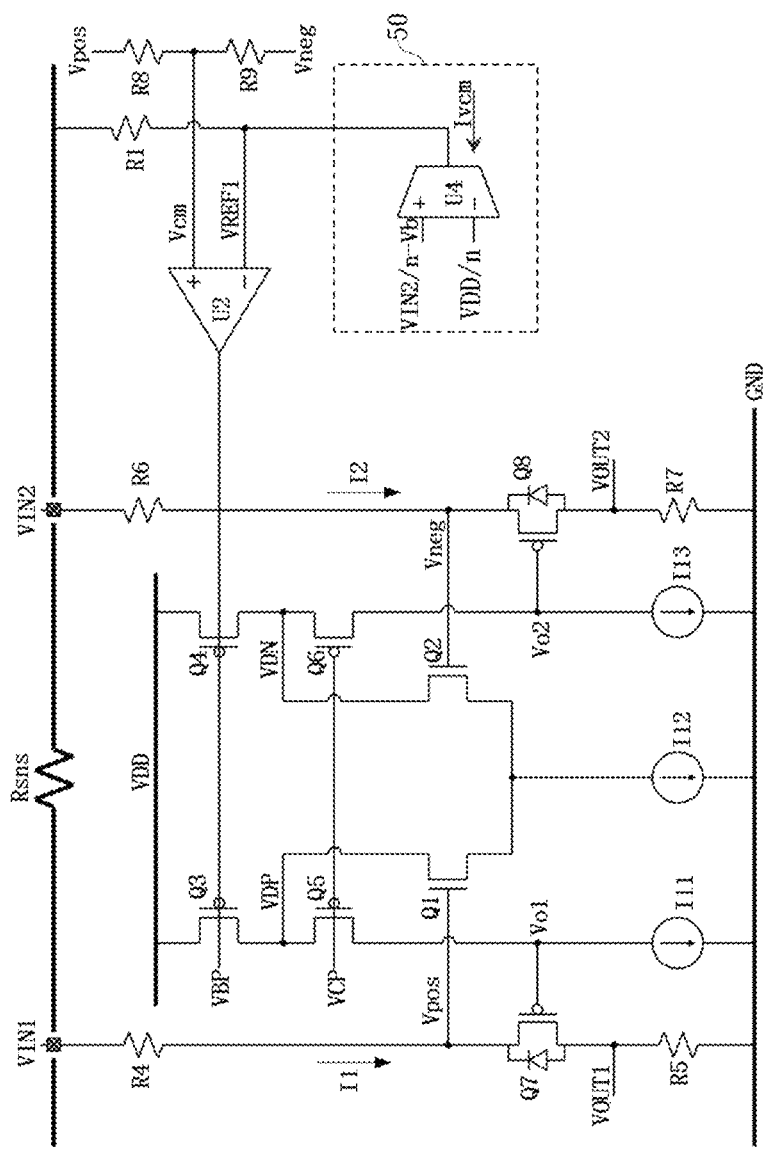
FIG. 7 is a schematic diagram of a circuit structure of a current detection circuit provided by another embodiment of the present application.

For another example, in another embodiment, as shown in FIG. 7, the second feedback branch 50 includes a second transconductance amplifier U4. The second terminal of the second transconductance amplifier U4 is used for receiving the first voltage signal representing the second input voltage VIN2, and the third terminal of the second transconductance amplifier U4 is used for receiving the first voltage signal representing the power supply voltage VDD of the signal amplification branch 50. The first terminal of the second transconductance amplifier U4 is connected to the first terminal of the first resistor R1 and the fourth terminal of the first feedback branch.

The first voltage signal VS1 is a voltage corresponding to the second input voltage VIN2, which may be set according to actual application conditions, which are not specifically limited in this embodiment of the present application. For example, in one embodiment, the first voltage signal VS1 is the difference between 1/n of the second input voltage and the first preset bias voltage Vb. That is, VS1=VIN2/n-Vb, n≥1. The purpose of dividing the second input voltage VIN2 by n is to prevent the second input voltage VIN2 from exceeding the power supply voltage of the second transconductance amplifier and causing the second transconductance amplifier to fail. The first preset bias voltage Vb may be set according to the actual situation, which is not specifically limited in this embodiment of the present application.

Secondly, the second voltage signal VS2 is a voltage corresponding to the power supply voltage VDD, which may be specifically set according to actual application conditions, which are not specifically limited in this embodiment of the present application. For example, in one embodiment, the second voltage signal VS2 is 1/n of the supply voltage VDD. That is, VS2=VDD/n. The voltage division ratio here needs to be the same as the voltage division ratio of the first voltage signal VS1 to the second input voltage VIN2. In this embodiment, a signal representing the second input voltage VIN2 is input to the second terminal of the second transconductance amplifier U4 as an example. In other embodiments, the second terminal of the second transconductance amplifier U4 can also be used to receive a signal representing the first input voltage VIN1, and the specific implementation process is the same as the input of the second terminal of the second transconductance amplifier U4 being a signal representing the second input voltage VIN2, which is within the scope of easy understanding by those skilled in the art, and will not be repeated herein.

In this embodiment, by sensing the voltage difference between the first input voltage VIN1 and the supply voltage VDD, or between the second input voltage VIN2 and the supply voltage VDD, the dynamic adjustment to the first reference voltage VREF1 is realized. Different from the closed-loop control of the first feedback current Ivcm based on sensing the first common mode value VDScm of the first transistor Q1 and the second transistor Q2 in FIG. 4, the circuit shown in FIG. 7 is based on sensing the second input voltage VIN2 and the supply voltage VDD and performing open-loop control on the first feedback current Ivcm. The second transconductance amplifier U4 may be configured so that when the difference between the divided second input voltage VIN2 and the divided supply voltage VDD (VIN2−VDD)/n is less than a preset threshold, the first feedback current Ivcm output by the branch 50 will remain unchanged at the preset current value Iset. That is, the difference Δv between the second input voltage VIN2 and the first reference voltage VREF1 is kept constant. When the difference between the divided second input voltage VIN2 and the divided supply voltage VDD (VIN2−VDD)/n is greater than the preset threshold, the first feedback current Ivcm output by the second feedback branch 50 will increase, i.e. ΔV increases. That is, the first reference voltage VREF1 is decreased while the second input voltage VIN2 remains unchanged. In this way, as VREF1 decreases, the common mode value Vcm of the first voltage Vpos and the second voltage Vneg decreases accordingly, so that the first transistor Q1 and the second transistor Q2 can keep working in the saturation region.

Specifically, the common mode value Vcm of the circuit in FIG. 7 can be expressed as: Vcm=VREF1=VIN2−Icvm×R1=VIN2−(gm×(VIN2/n−Vb−VDD/n)+Ib2)×r1. Among them, r1 is the resistance value of the first resistor R1, gm is the gain (transconductance) of the second transconductance amplifier U4, and Ib2 is the DC bias current output by the second transconductance amplifier U4 or the output of the second transconductance amplifier U4. The DC current bias is provided by a current source in parallel. It can be seen that by configuring the gain gm of the second transconductance amplifier U4 to be n/r1, the first reference voltage VREF1 can maintain a fixed difference from the power supply voltage VDD, namely: VREF1=VDD+n×Vb−Ib×r1. The difference between the first reference voltage VREF1 and the power supply voltage VDD can be set by configuring the fixed first preset bias voltage Vb and the fixed DC bias current Ib2, so that the common mode value Vcm can be kept at a fixed and sufficient voltage difference Δv' lower than the power supply voltage VDD. A fixed and sufficient voltage difference Δv' is maintained between the two to ensure that the first transistor Q1 and the second transistor Q2 operate in the saturation region.

The non-linear relationship between the differential input voltage ΔVDn of the second transconductance amplifier U4 and the first feedback current Ivcm can be realized by utilizing the output saturation characteristic of the second transconductance amplifier U4.

Figure 8:
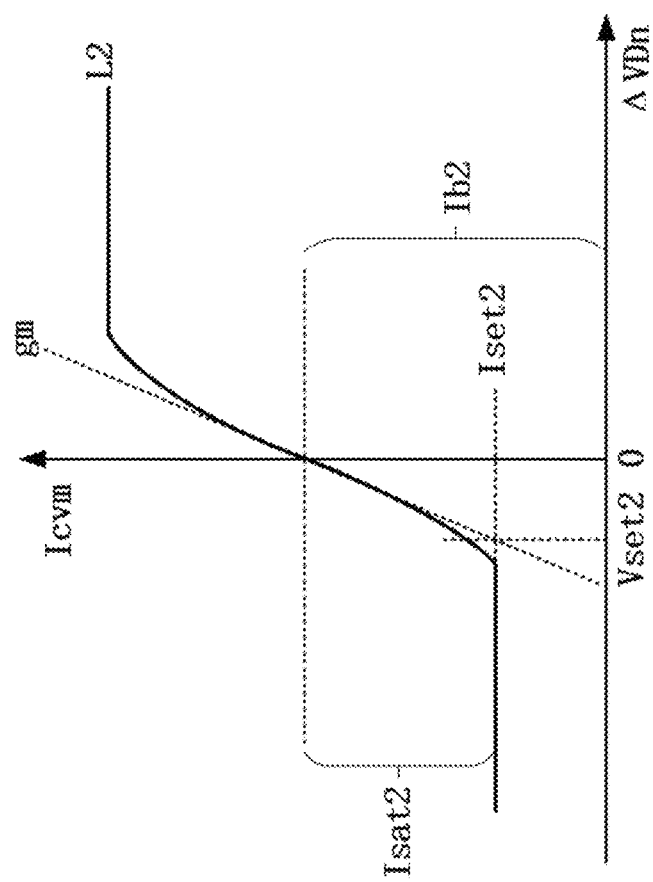
FIG. 8 is a schematic diagram of input and output characteristics of a second transconductance amplifier provided by an embodiment of the present application.

Please refer to FIG. 8, which is a diagram of the input and output characteristics of the second transconductance amplifier. As shown in FIG. 8, the horizontal axis represents the differential input voltage of the second transconductance amplifier U4. That is, the difference between the first voltage signal VS1 and the second voltage signal VS2, where VS1=VIN2/n-Vb, and VS2=VDD/n. Then, ΔVDn=VS1−VS2=(VIN2−VDD)/n−Vb. The vertical axis represents the first feedback current Ivcm. It can be seen from the figure that the output current Ivcm of the second transconductance amplifier includes two parts, a second DC bias current Ib2 and a second AC output current L2. The second DC bias current Ib2 can be provided by the second transconductance amplifier or by an external current source connected in parallel with it. If the first feedback current Ivcm only includes the second AC output current L2, then the first feedback current Ivcm at the output of the second transconductance amplifier will be 0 when the differential input voltage of the second transconductance amplifier (i.e. the difference ΔVDn) is 0. When the differential input voltage ΔVDn is less than the saturation threshold (e.g., Vset2) the AC output current reaches the saturation value −Isat2. In this embodiment, the first preset bias voltage Vb and the second DC bias current Ib2 can be reasonably configured so that when the voltage difference between the second input voltage VIN2 and the supply voltage VDD exceeds the minimum voltage difference to keep both the first transistor Q1 and the second transistor Q2 in the saturation region, the differential input voltage $\Delta$VDn of the second transconductance amplifier U4 is near the saturation voltage Vset2, and the first feedback current Icvm is the preset current Iset2. At the same time, the transconductance gm of the second transconductance amplifier U4 can be controlled to be close to n/r1, so that when the differential input voltage $\Delta$VDn of the second transconductance amplifier U4 is greater than the saturation voltage Vset2, the first feedback current Icvm output by the second transconductance amplifier U4 keeps the voltage difference between the power supply voltage VDD and the first reference voltage VREF1 stable, so as to control the voltage difference $\Delta$v' between the common mode voltage Vcm and the power supply voltage VDD near constant.

In this way, the nonlinear relationship between the first feedback current Icvm output by the second transconductance amplifier U4 and the differential input voltage $\Delta$VDn described above can be realized. That is, when the difference between the power supply voltage VDD and the second input voltage VIN2 is greater than the preset voltage threshold, the difference between the first reference voltage VREF1 and the second input voltage VIN2 is controlled to be constant. When the difference between the power supply voltage VDD and the second input voltage VIN2 is smaller than the preset voltage threshold, the difference between the first reference voltage VREF1 and the power supply voltage VDD is controlled to be constant. The relationship between the second input voltage VIN2 and the first reference voltage VREF1 is shown in FIG. 9.

Figure 9:
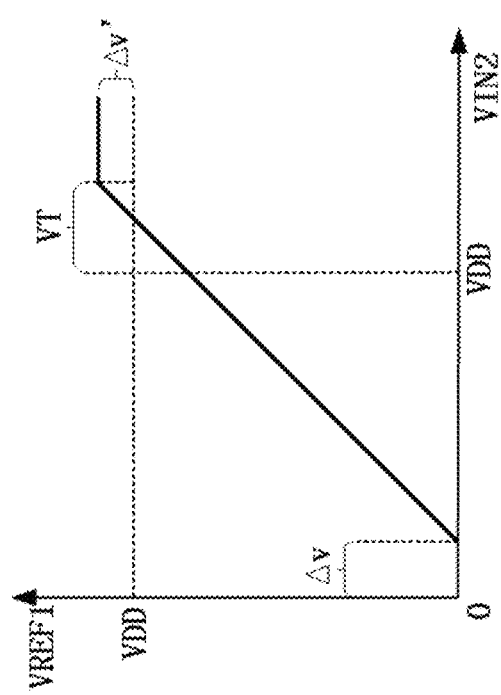
FIG. 9 is a schematic diagram of a relationship between a first reference voltage and a second input voltage provided by an embodiment of the present application.

Referring to FIG. 9, it can be seen that when the difference between the second input voltage VIN2 and the power supply voltage VDD is smaller than the preset threshold VT. The first reference voltage VREF1 is configured as VIN2-Av. That is, VREF1 increases along with the second input voltage VIN2 with the same amount. When the difference between the second input voltage VIN2 and the supply voltage VDD is greater than the preset threshold VT, the first reference voltage VREF1 is configured to keep the difference between the second input voltage VIN2 and the supply voltage VDD fixed at Av'. Since the power supply voltage VDD of the circuit remains constant, the first reference voltage VREF1 also remains constant at this time. As mentioned before, Av can be 250 mV, and Av' can be configured as the difference between the threshold voltage Vth of the second transistor Q2 and the saturated drain-source voltage of the fourth transistor Q4 and the sixth transistor Q6. That is, $\Delta$v'=Vth−Vdssat−Vdssat≈0.3V. The threshold voltage VT is VT=$\Delta$v'+$\Delta$v=0.55V.

In practical implementations, considering the process and temperature margins, and the input voltage range of the comparator U2, it is common to choose $\Delta$V'=−$\Delta$V'≈−250 mV. At this time, VT=0. That is, when VIN2=VDD, the configuration of the first reference voltage VREF1 changes from following the second input voltage VIN2 with a fixed voltage difference $\Delta$v to following the supply voltage VDD with a fixed voltage difference $\Delta$v (i.e. remains constant at VDD−$\Delta$v). In combination with the foregoing analysis, when the preset threshold VT=0, the selection of the first preset bias voltage Vb is simplified as the saturation threshold voltage Vset2 of the second transconductance amplifier.

Figure 10:
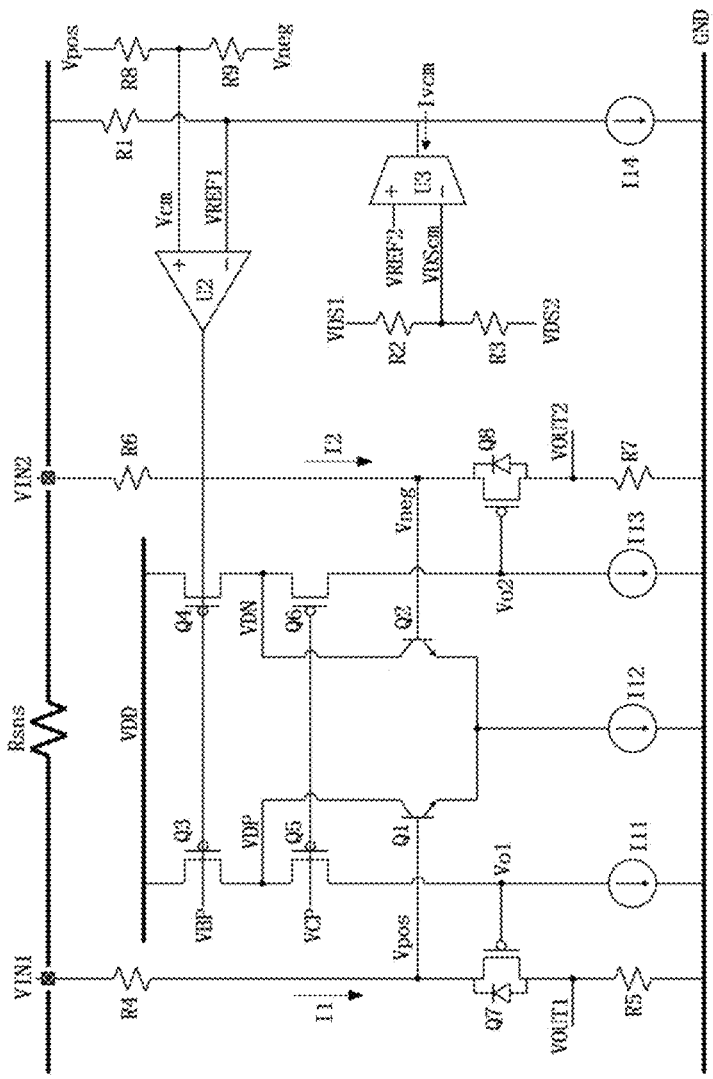
FIG. 10 is a schematic diagram of a circuit structure of a current detection circuit provided by another embodiment of the present application.

For another example, in another embodiment, as shown in FIG. 10, the second feedback branch further includes a fourth current source I14. The negative terminal of the fourth current source I14 is connected to the first terminal of the first transconductance amplifier U3, and the positive terminal of the fourth current source I14 is grounded. The fourth current source I14 may be used to provide the first DC bias current Ib1 or the second DC bias current Ib2.

It can be understood that, for any embodiment in this application, the fourth current source I14 can be added in the same way as the circuit structure shown in FIG. 10, and the specific implementation is the same as that of the circuit structure shown in FIG. 10. The implementation manner is similar, which is easily understood by those skilled in the art and will not be repeated herein.

Figure 11:
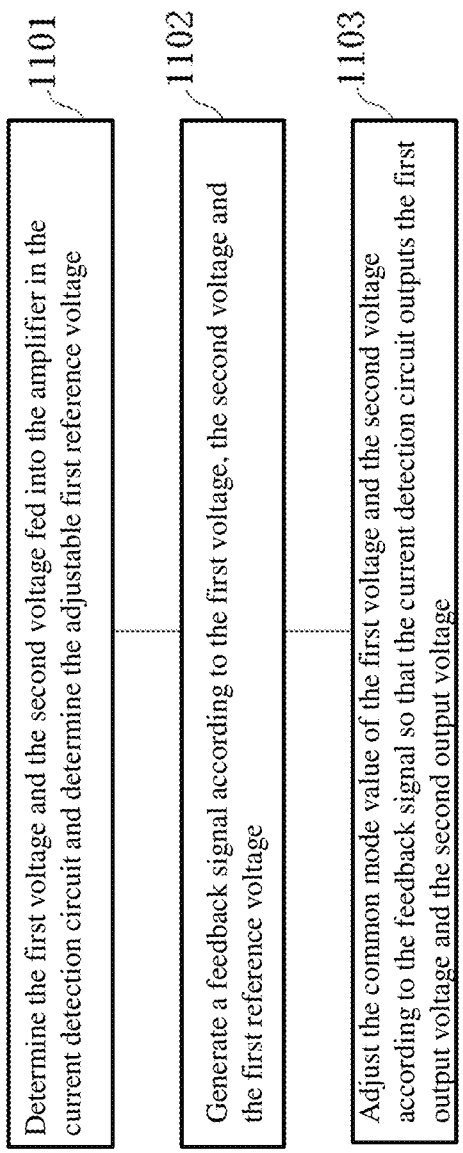
FIG. 11 is a flowchart of a control method of a current detection circuit provided by an embodiment of the present application.

FIG. 11 is a flowchart of a control method of a current detection circuit provided by an embodiment of the present application. The first terminal of the current detection circuit is connected to the first input voltage. The second terminal of the current detection circuit is connected to the second input voltage, and the current detection circuit is used to output the first output voltage and the second output voltage according to the first input voltage and the second input voltage, to determine the current between the first terminal and the second terminal of the current detection circuit according to the first output voltage and the second output voltage. Reference may be made to the above-mentioned specific descriptions for FIG. 1 to FIG. 10 for the structure of the current detection circuit, which will not be repeated herein. The control method of the current detection circuit includes the following steps:

Step 1101: Determine the first voltage and the second voltage input to the amplifier in the current detection circuit and determine the adjustable first reference voltage.

Figure 12:
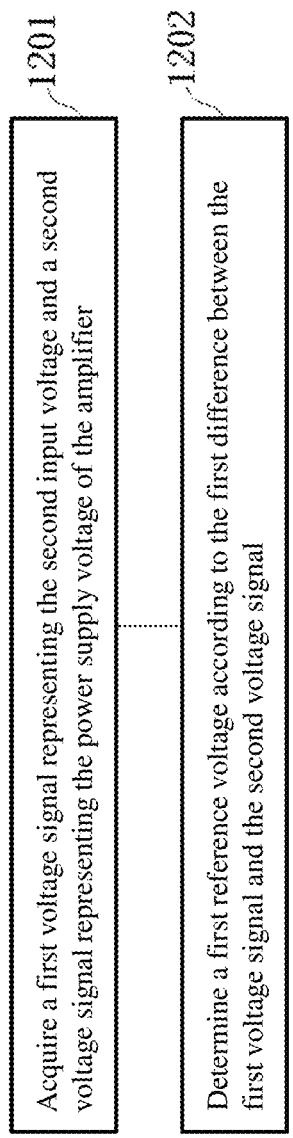
FIG. 12 is a schematic diagram of an implementation manner of step 1101 shown in FIG. 11 provided by this embodiment of the application.
Figure 13:
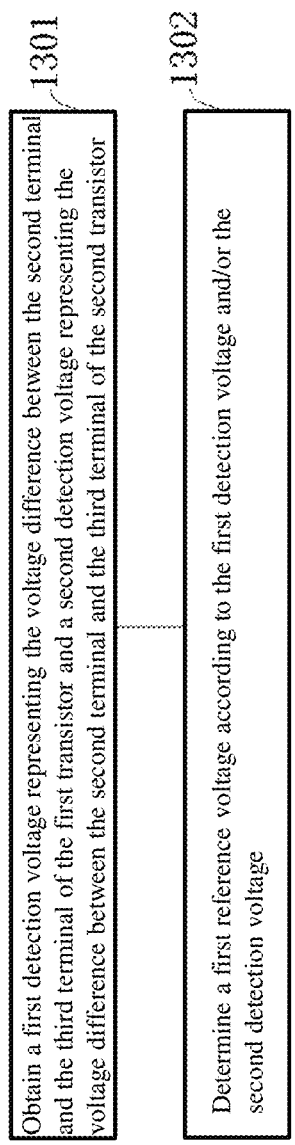
FIG. 13 is a schematic diagram of another implementation manner of step 1101 shown in FIG. 11 provided by this embodiment of the application.

In one embodiment, as shown in FIG. 12, determining the adjustable first reference voltage in step 1101 specifically includes the following methods:

Step 1201: Acquire a first voltage signal representing the second input voltage and a second voltage signal representing the power supply voltage of the amplifier.

Step 1202: Determine a first reference voltage according to the first difference between the first voltage signal and the second voltage signal.

Specifically, in one embodiment, if the first difference is not greater than the first preset difference, the voltage difference between the second input voltage and the first reference voltage is kept constant.

In another embodiment, if the first difference is greater than the first predetermined difference, the first reference voltage is kept constant.

The first preset difference can be set according to the actual application situation, which is not specifically limited in this embodiment of the present application.

For example, in some embodiments, the first preset difference is zero. At this time, if the second input voltage is smaller than the supply voltage, the voltage difference between the first reference voltage and the second input voltage is kept constant. If the second input voltage is greater than the supply voltage, the voltage difference between the first reference voltage and the supply voltage is kept constant.

Specifically, in this embodiment, when the second input voltage is greater than the supply voltage, the voltage difference between the first reference voltage and the supply voltage is kept constant, so that the devices in the current detection circuit are kept in a saturated state. On the contrary, when the second input voltage is smaller than the supply voltage, the voltage difference between the first reference voltage and the second input voltage is kept constant. At the same time, the constant voltage difference between the first reference voltage and the second input voltage (denoted as the first voltage difference) is equal to the constant voltage difference between the first reference voltage and the supply voltage (denoted as the second voltage difference). That is, the first voltage difference is equal to the second voltage difference.

In another embodiment, the amplifier includes a first transistor and a second transistor. The first terminal of the first transistor is connected to the first input voltage, and the first terminal of the second transistor is connected to the second input voltage. In this case, determining the adjustable first reference voltage in step 1101 specifically includes the following methods:

Step 1301: Obtain a first detection voltage representing the voltage difference between the second terminal and the third terminal of the first transistor and a second detection voltage representing the voltage difference between the second terminal and the third terminal of the second transistor.

Step 1302: Determine a first reference voltage according to the first detection voltage and/or the second detection voltage.

Specifically, in one embodiment, if the first detection voltage is not greater than the first voltage threshold, and/or the second detection voltage is not greater than the first voltage threshold, the first reference voltage is lowered.

In another embodiment, if the first detection voltage is greater than the first voltage threshold and the second detection voltage is greater than the first voltage threshold, the voltage difference between the first reference voltage and the second input voltage is kept constant.

In this embodiment, when the first detection voltage is not greater than the first voltage threshold, and/or, when the second detection voltage is not greater than the first voltage threshold, the first reference voltage is lowered to keep the devices in the current detection circuit in a saturation state. Conversely, when the first detection voltage is greater than the first voltage threshold and the second detection voltage is greater than the first voltage threshold, the voltage difference between the first reference voltage and the second input voltage is kept constant.

The first voltage threshold may be set according to actual application conditions, which is not specifically limited in this embodiment of the present application.

Step 1102: Generate a feedback signal according to the first voltage, the second voltage and the first reference voltage.

In one embodiment, the common mode value of the first voltage and the second voltage may be obtained first, and the feedback signal may be obtained according to the difference between the common mode value and the first reference voltage.

Step 1103: Adjust the common mode value of the first voltage and the second voltage according to the feedback signal so that the current detection circuit outputs the first output voltage and the second output voltage.

By configuring an adjustable first reference voltage to output a corresponding feedback signal, and adjusting the common mode value of the first voltage and the second voltage according to the feedback signal, the devices in the current detection circuit, such as the first transistor and the second transistor can be kept in saturation state, even when the difference between the supply voltage and the first input voltage increases to greater than or equal to the first preset difference, and/or, the difference between the second input voltage and the supply voltage increases to greater than or equal to the first preset difference, so that the first output voltage and the second output voltage output by the current detection circuit can be properly obtained. That is, the current detection circuit can function properly.

In one embodiment, the current detection circuit further includes a second feedback branch and a first resistor. The second feedback branch is connected to the second input voltage through the first resistor. The connection point between first resistor and the second feedback branch is used to output the first reference voltage. Then, the specific implementation process of reducing the first reference voltage in the above steps may include: increasing the first feedback current output by the second feedback branch to increase the voltage drop of the first resistor, wherein, if the voltage drop of the first resistor increases, the first reference voltage decreases.

It is understandable that the beneficial effects produced in the method embodiments may reference the corresponding descriptions in the above-mentioned current detection circuit embodiments, which are not repeated herein for brevity.

Embodiment of the present application provides a control device 1400 for a current detection circuit, where the control device 1400 for the current detection circuit may be implemented as a Microcontroller Unit (MCU, MCU) or a digital signal processing (Digital Signal Processing, DSP) controller and the like.

Figure 14:
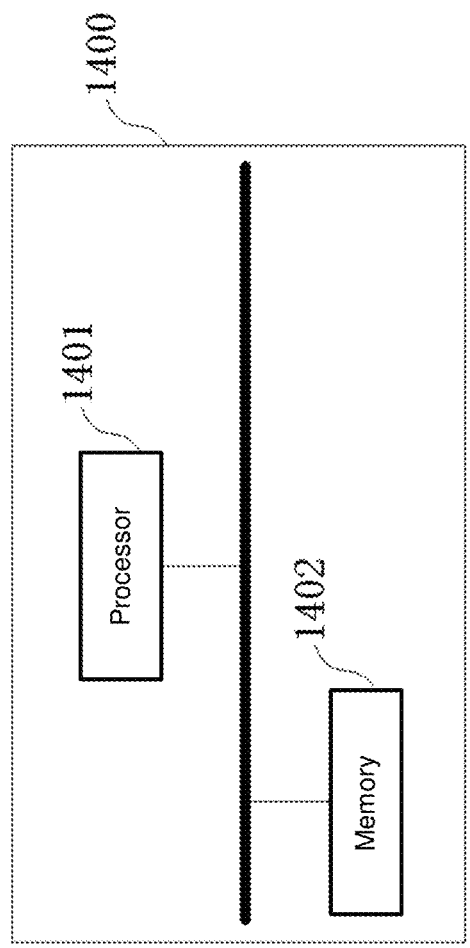
FIG. 14 is a schematic diagram of a control device of a current detection circuit provided by an embodiment of the present application.

As shown in FIG. 14, the control device 1400 of the current detection circuit includes at least one processor 1401 and a memory 1402. The memory 1402 can be built in the control device 1400 of the current detection circuit, or can be externally placed in the control device of the current detection circuit outside the device 1400. The memory 1402 may also be a remotely set memory, which is connected to the control device 1400 of the current detection circuit through a network.

The memory 1402, as a non-volatile computer-readable storage medium, can be used to store non-volatile software programs, non-volatile computer-executable programs and modules. The memory 1402 may include a storage program area and a storage data area, wherein the storage program area may store an operating system, an application program required by at least one function; the storage data area may store data created according to the use of the terminal, and the like. Additionally, memory 1402 may include high-speed random access memory, and may also include non-volatile memory, such as at least one magnetic disk storage device, flash memory device, or other non-volatile solid state storage device. In some embodiments, the memory 1402 may optionally include memory located remotely from the processor 1401, and these remote memories may be connected to the terminal via a network. Examples of such networks include, but are not limited to, the Internet, an intranet, a local area network, a mobile communication network, and combinations thereof.

The processor 1401 executes various functions of the terminal and processes data by running or executing the software programs and/or modules stored in the memory 1402, and calling the data stored in the memory 1402, so as to monitor the terminal as a whole, for example, to achieve this. The control method of the current detection circuit described in any one of the embodiments of the application.

The number of processors 1401 may be one or more, and one processor 1401 is taken as an example in FIG. 14. The processor 1401 and the memory 1402 may be connected by a bus or other means. The processor 1401 may include a central processing unit (CPU), a digital signal processor (DSP), an application specific integrated circuit (ASIC), a controller, a field programmable gate array (FPGA) device, and the like. The processor 1401 may also be implemented as a combination of computing devices, e.g., a combination of a DSP and a microprocessor, multiple microprocessors, one or more microprocessors combined with a DSP core, or any other such configuration.

Embodiments of the present application further provide a current detection amplifier, including the current detection circuit in any embodiment of the present application, and/or a control device for the current detection circuit in any embodiment of the present application.

Embodiments of the present application also provide a non-volatile computer-readable storage medium, where the computer-readable storage medium stores computer-executable instructions, and the computer-executable instructions are executed by one or more processors, for example, executing the method steps of FIG. 11 described above.

Embodiments of the present application further provide a computer program product, including a computer program stored on a non-volatile computer-readable storage medium, where the computer program includes program instructions, and when the program instructions are executed by a computer, all computer executes the control method of the current detection circuit in any of the above method embodiments, for example, executes the method steps of FIG. 11 described above.

Finally, it should be noted that the above embodiments are only used to illustrate the technical solutions of the present application, but not to limit them; under the spirit of the present application, the technical features in the above embodiments or different embodiments can also be combined. The steps may be carried out in any order, and there are many other variations of the different aspects of the present application as described above, which are not provided in detail for the sake of brevity. Although the present application has been described in detail, person skilled in the art should understand that it is still possible to modify the technical solutions recorded in the foregoing embodiments, or to perform equivalent replacements on some of the technical features. These modifications or replacements do not make the essence of the corresponding technical solutions deviate from the scope of technical solutions.

What is claimed is:

1. A current detection circuit comprising:
a signal amplification branch, a first voltage branch, a second voltage branch and a first feedback branch, wherein:
a first terminal of the signal amplification branch is connected to the first terminal of the first voltage branch and the first terminal of the first feedback branch;
a second terminal of the signal amplification branch is connected to a second terminal of the first voltage branch;
a third terminal of the signal amplification branch is connected to a first terminal of the second voltage branch and a second terminal of the first feedback branch;
a fourth terminal of the signal amplification branch is connected to a second terminal of the second voltage branch;
a fifth terminal of the signal amplification branch is connected to a third terminal of the first feedback branch;
a third terminal of the first voltage branch is connected to a first input voltage;
a third terminal of the second voltage branch is connected to a second input voltage; and
a fourth terminal of the first feedback branch is used to receive a first reference voltage, and wherein:
the first feedback branch is configured to generate a feedback signal according to a first voltage generated by the first voltage branch, a second voltage generated by the second voltage branch, and the first reference voltage;
the signal amplification branch is used for generating a first amplified voltage according to the first voltage and the feedback signal, and generating a second amplified voltage according to the second voltage and the feedback signal;
the first voltage branch is used for generating the first voltage and a first output voltage according to the first input voltage and the first amplified voltage; and
the second voltage branch is used for generating the second voltage and a second output voltage according to the second input voltage and the second amplified voltage, and wherein:
the first output voltage is output from a fourth terminal of the first voltage branch;
the second output voltage is output from a fourth terminal of the second voltage branch; and
the first output voltage and the second output voltage are used to determine a difference between the first input voltage and the second input voltage so as to determine a current between the third terminal of the first voltage branch and the third terminal of the second voltage branch.

2. The current detection circuit according to claim 1, wherein the current detection circuit further comprises a second feedback branch and a first resistor, and wherein:
a first terminal of the second feedback branch is connected to a first terminal of the first resistor and the fourth terminal of the first feedback branch; and
a second terminal of the first resistor is connected to the second input voltage, and wherein:
the second feedback branch is used for providing a first feedback current to generate a voltage drop across the first resistor, and the first reference voltage is determined according to the voltage drop and the second input voltage.

3. The current detection circuit according to claim 2, wherein:
the signal amplification branch comprises an amplifier comprising a first transistor and a second transistor, and wherein:
a first terminal of the first transistor is the first terminal of the signal amplification branch; and
a first terminal of the second transistor is the third terminal of the signal amplification branch;
the second feedback branch includes a first transconductance amplifier or a second transconductance amplifier, and wherein:
when the second feedback branch includes the first transconductance amplifier, the second feedback branch further includes a second resistor and a third resistor, and wherein:
a second terminal of the first transconductance amplifier is connected to a first terminal of the second resistor and a first terminal of the third resistor; and
a third terminal of the first transconductance amplifier is used for receiving the second reference voltage;

a first terminal of the first transconductance amplifier is connected to the first terminal of the first resistor and the fourth terminal of the first feedback branch;

a second terminal of the second resistor is used for receiving a first detection voltage representing a voltage difference between a second terminal and a third terminal of the first transistor; and a second terminal of the third resistor is used for receiving a second detection voltage representing a voltage difference between a second terminal and a third terminal of the second transistor; and when the second feedback branch includes the second transconductance amplifier, a second terminal of the second transconductance amplifier is used for receiving a first voltage signal representing the second input voltage, and a third terminal of the second transconductance amplifier is used for receiving a second voltage signal representing a supply voltage of the signal amplification branch; and a first terminal of the second transconductance amplifier is connected to the first terminal of the first resistor and the fourth terminal of the first feedback branch.

4. The current detection circuit according to claim 3, wherein the second feedback branch further comprises a fourth current source, and a positive terminal of the fourth current source is grounded, and wherein a negative terminal of the fourth current source is connected to the first terminal of the first transconductance amplifier, or the negative terminal of the fourth current source is connected to the first terminal of the second transconductance amplifier.

5. The current detection circuit according to claim 3, wherein:

the first voltage signal is a difference between 1/n of the second input voltage and a first preset bias voltage, and n≥1; and the second voltage signal is 1/n of a supply voltage.

6. The current detection circuit according to claim 3, wherein:

the first voltage signal is a difference between 1/n of the second input voltage and a first preset bias voltage, and n≥1; and the second voltage signal is 1/n of a supply voltage, and wherein a gain of the second transconductance amplifier is n/r1, and wherein r1 is the resistance value of the first resistor.

7. The current detection circuit according to claim 3, wherein the amplifier in the signal amplification branch further comprises a third transistor, a fourth transistor, a fifth transistor, a sixth transistor, a first current source, a second current source and a third current source, and wherein:

a first terminal of the third transistor is connected to a first terminal of the fourth transistor and the third terminal of the first feedback branch;

a second terminal of the third transistor is connected to a second terminal of the fourth transistor and the supply voltage;

a third terminal of the third transistor is connected to a second terminal of the fifth transistor and a third terminal of the first transistor;

the second terminal of the first transistor is connected to the second terminal of the second transistor and a negative terminal of the second current source;

a first terminal of the fifth transistor and a first terminal of the sixth transistor are both used for receiving a third voltage;

a third terminal of the fifth transistor is connected to the second terminal of the first voltage branch and a negative terminal of the first current source;

a third terminal of the fourth transistor is connected to a second terminal of the sixth transistor and the third terminal of the second transistor;

a third terminal of the sixth transistor is connected to the second terminal of the second voltage branch and a negative terminal of the third current source; and a positive terminal of the first current source, a positive terminal of the second current source, and a positive terminal of the third current source are all grounded.

8. The current detection circuit according to claim 1, wherein the first voltage branch comprises a fourth resistor, a seventh transistor and a fifth resistor, and wherein:

a first terminal of the fourth resistor is connected to the first input voltage;

a second terminal of the fourth resistor is connected to a second terminal of the seventh transistor and the first terminal of the signal amplification branch;

a first terminal of the seventh transistor is connected to the second terminal of the signal amplification branch;

a third terminal of the seventh transistor is connected to a first terminal of the fifth resistor; and a second terminal of the fifth resistor is grounded, and wherein a third terminal of the seventh transistor is the fourth terminal of the first voltage branch.

9. The current detection circuit according to claim 1, wherein the second voltage branch comprises a sixth resistor, an eighth transistor and a seventh resistor, and wherein:

a first terminal of the sixth resistor is connected to the second input voltage;

a second terminal of the sixth resistor is connected to a second terminal of the eighth transistor and the third terminal of the signal amplification branch;

a first terminal of the eighth transistor is connected to the fourth terminal of the signal amplification branch;

a third terminal of the eighth transistor is connected to a first terminal of the seventh resistor; and a second terminal of the seventh resistor is grounded, and wherein, a third terminal of the eighth transistor is the fourth terminal of the second voltage branch.

10. The current detection circuit according to claim 1, wherein the first feedback branch comprises an eighth resistor, a ninth resistor and a comparator, and wherein:

a first terminal of the eighth resistor is connected to the first terminal of the signal amplification branch;

a second terminal of the eighth resistor is connected to a first terminal of the ninth resistor and a first input terminal of the comparator;

a second terminal of the ninth resistor is connected to the third terminal of the signal amplification branch;

a second input terminal of the comparator is used to receive the first reference voltage; and an output terminal of the comparator is connected to the fifth terminal of the signal amplification branch.

11. A method for controlling a current detection circuit, wherein a first terminal of the current detection circuit is connected to a first input voltage, a second terminal of the current detection circuit is connected to a second input voltage, and the current detection circuit is configured to output a first output voltage and a second output voltage according to the first input voltage and the second input voltage, so as to determine a current between the first terminal and the second terminal of the current detection circuit based on the first output voltage and the second output voltage, the method comprising:

determining a first voltage and a second voltage input to an amplifier in the current detection circuit, and determining a first reference voltage configured to be adjustable;

generating a feedback signal according to the first voltage, the second voltage and the first reference voltage; and generating a first output voltage and a second output voltage through adjusting a voltage based on the feedback signal, wherein the voltage is obtained from a midpoint of a resistor divider, and wherein a first terminal of the resistor divider is coupled to the first voltage, and a second terminal of the resistor divider is coupled to the second voltage.

12. The method according to claim 11, wherein the step of determining the first reference voltage configured to be adjustable comprises:

obtaining a first voltage signal representing the second input voltage, and a second voltage signal representing a supply voltage of the amplifier; and determining the first reference voltage according to a first difference between the first voltage signal and the second voltage signal.

13. The method of claim 12, wherein:

if the first difference is not greater than a first preset difference, a voltage difference between the second input voltage and the first reference voltage is kept constant.

14. The method of claim 12, wherein:

if the first difference is greater than a first preset difference, the first reference voltage is kept constant.

15. The method of claim 12, wherein:

if the second input voltage is less than the supply voltage, a voltage difference between the first reference voltage and the second input voltage is kept constant; and if the second input voltage is greater than the supply voltage, a voltage difference between the first reference voltage and the supply voltage is kept constant, and wherein the voltage difference between the first reference voltage and the second input voltage is equal to the voltage difference between the first reference voltage and the power supply voltage.

16. The method of claim 11, wherein the amplifier comprises a first transistor and a second transistor, and wherein:

a first terminal of the first transistor is connected to the first input voltage, and the first terminal of the second transistor the is connected to the second input voltage, and wherein the step of determining the adjustable first reference voltage includes:

obtaining a first detection voltage representing a voltage difference between a second terminal and a third terminal of the first transistor, and a second detection voltage representing a voltage difference between a second terminal and a third terminal of the second transistor, and wherein the first reference voltage is determined according to the first detection voltage, and/or the second detection voltage.

17. The method of claim 16, wherein:

if the first detection voltage is not greater than the first voltage threshold, and/or the second detection voltage is not greater than the first voltage threshold, the first reference voltage is lowered.

18. The method of claim 17, wherein:

if the first detection voltage is greater than the first voltage threshold, and the second detection voltage is greater than the first voltage threshold, a voltage difference between the first reference voltage and the second input voltage is maintained constant.

* * * * *